US012563810B1

(12) United States Patent
Mehta et al.

(10) Patent No.: US 12,563,810 B1
(45) Date of Patent: Feb. 24, 2026

(54) SELECTIVE BACKSIDE RECESSING OF SOURCE AND DRAIN REGIONS

(71) Applicant: Intel Corporation, Santa Clara, CA (US)

(72) Inventors: Jaladhi Mehta, Beaverton, OR (US); Giorgio Mariottini, Hillsboro, OR (US); Weihong Gao, Portland, OR (US); Lin Hu, Portland, OR (US); Conor P. Puls, Portland, OR (US); Brian Greene, Portland, OR (US); Chung-Hsun Lin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 326 days.

(21) Appl. No.: 18/216,885

(22) Filed: Jun. 30, 2023

(51) Int. Cl.
| | |
|---|---|
| *H01L 29/08* | (2006.01) |
| *H01L 29/06* | (2006.01) |
| *H01L 29/423* | (2006.01) |
| *H01L 29/775* | (2006.01) |
| *H10D 30/43* | (2025.01) |
| *H10D 30/67* | (2025.01) |
| *H10D 62/10* | (2025.01) |
| *H10D 62/13* | (2025.01) |
(Continued)

(52) U.S. Cl.
CPC ........... *H10D 64/258* (2025.01); *H10D 30/43* (2025.01); *H10D 30/6735* (2025.01); *H10D 62/121* (2025.01); *H10D 62/151* (2025.01); *H10D 84/83* (2025.01)

(58) Field of Classification Search
CPC .... H10D 30/014; H10D 30/024; H10D 30/43; H10D 30/62; H10D 30/6211; H10D 30/6212; H10D 30/6213; H10D 30/6219; H10D 30/6713; H10D 30/6735; H10D 30/797; H10D 62/021; H10D 62/118; H10D 62/119; H10D 62/121; H10D 62/149; H10D 62/151; H10D 64/258; H10D 84/013; H10D 84/0158; H10D 84/017; H10D 84/0193; H10D 84/83; H10D 84/834; H10D 84/853
See application file for complete search history.

(56) References Cited

U.S. PATENT DOCUMENTS

| | | | | |
|---|---|---|---|---|
| 12,426,297 B2 * | 9/2025 | Chen | ..................... | H10D 62/121 |
| 2023/0395434 A1 * | 12/2023 | Lai | ........................ | H10D 64/015 |
(Continued)

*Primary Examiner* — David C Spalla
(74) *Attorney, Agent, or Firm* — Arcane Law PLLC

(57) ABSTRACT

Techniques are provided herein to form an integrated circuit having source and/or drain regions with shaped bottom surfaces to reduce parasitic capacitance. In an example, the bottom portions of the source and/or drain regions may be etched from the backside to form inwardly tapered ends. An array of semiconductor devices each include a semiconductor region extending (e.g., in a first direction) from a source region to a drain region, with a gate structure extending (e.g., in a second direction perpendicular to the first direction) over the semiconductor region. A lower portion of the source and/or drain regions (e.g., a portion at least extending below the semiconductor region) has an inwardly tapered shape. The inward taper may be provided using a backside etching process. The tapered ends of the source and/or drain regions have an increased distance to the adjacent gate structures, thus reducing the parasitic capacitance.

20 Claims, 16 Drawing Sheets

(51) Int. Cl.
      *H10D 64/23*      (2025.01)
      *H10D 84/83*      (2025.01)

(56)             References Cited

U.S. PATENT DOCUMENTS

2023/0395662 A1* 12/2023 Jeong ................... H10D 62/151
2024/0371930 A1* 11/2024 Lin ...................... H10D 84/038

* cited by examiner 204
202
201

204
202
201

1400

1500

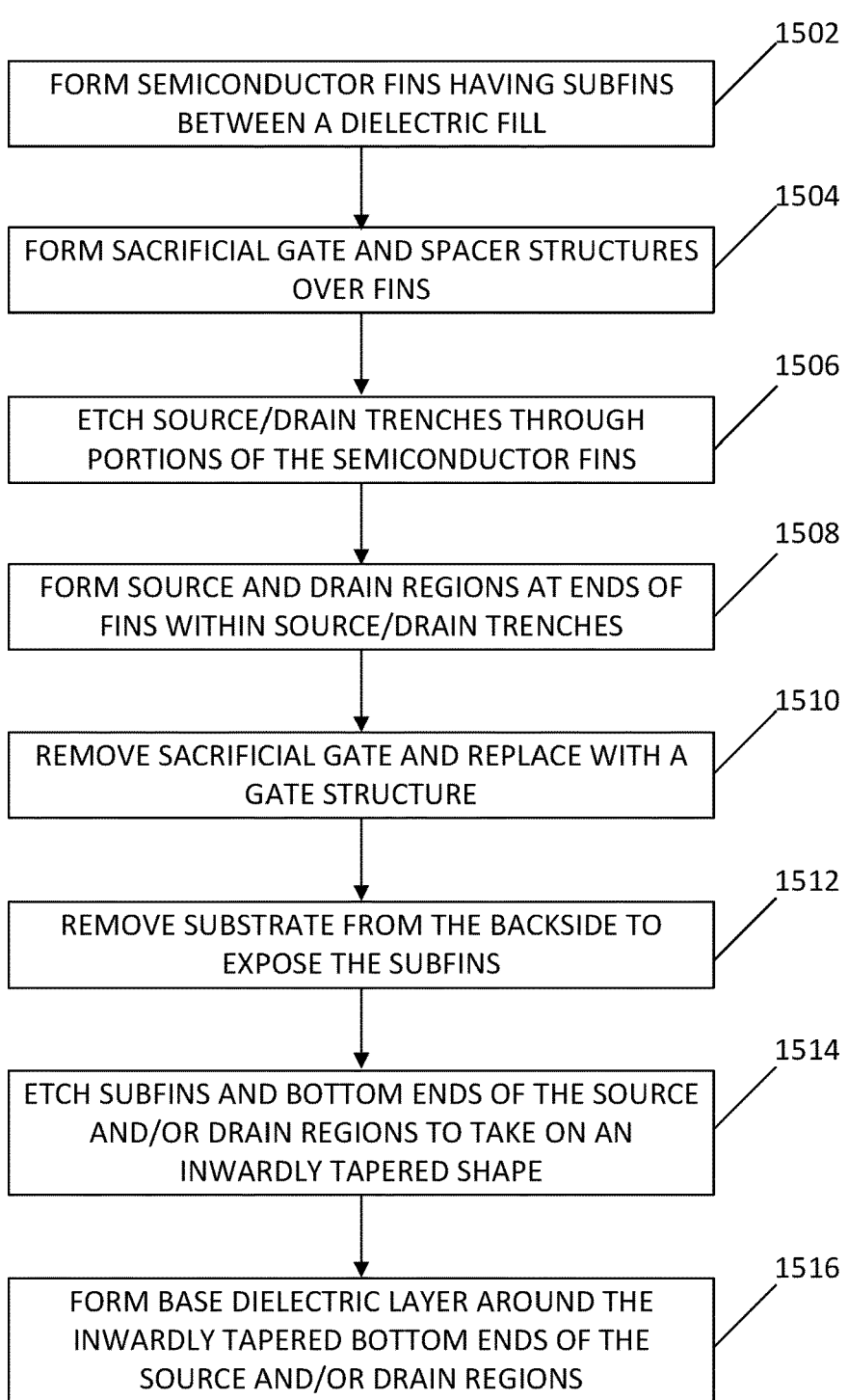

FORM SEMICONDUCTOR FINS HAVING SUBFINS
BETWEEN A DIELECTRIC FILL — 1502

FORM SACRIFICIAL GATE AND SPACER STRUCTURES
OVER FINS — 1504

ETCH SOURCE/DRAIN TRENCHES THROUGH
PORTIONS OF THE SEMICONDUCTOR FINS — 1506

FORM SOURCE AND DRAIN REGIONS AT ENDS OF
FINS WITHIN SOURCE/DRAIN TRENCHES — 1508

REMOVE SACRIFICIAL GATE AND REPLACE WITH A
GATE STRUCTURE — 1510

REMOVE SUBSTRATE FROM THE BACKSIDE TO
EXPOSE THE SUBFINS — 1512

ETCH SUBFINS AND BOTTOM ENDS OF THE SOURCE
AND/OR DRAIN REGIONS TO TAKE ON AN
INWARDLY TAPERED SHAPE — 1514

FORM BASE DIELECTRIC LAYER AROUND THE
INWARDLY TAPERED BOTTOM ENDS OF THE
SOURCE AND/OR DRAIN REGIONS — 1516

FIG. 15

SELECTIVE BACKSIDE RECESSING OF SOURCE AND DRAIN REGIONS

FIELD OF THE DISCLOSURE

The present disclosure relates to integrated circuits, and more particularly, to source and drain structures.

BACKGROUND

As integrated circuits continue to scale downward in size, a number of challenges arise. For instance, reducing the size of memory and logic cells within the interconnect structure is becoming increasingly more difficult, as is reducing device spacing at the device layer. As device density increases, parasitic effects can become more pronounced and degrade performance. Accordingly, there remain a number of non-trivial challenges with respect to forming such high-density semiconductor devices.

BRIEF DESCRIPTION OF THE DRAWINGS

FIG. 15 is a flowchart of a fabrication process for a semiconductor device having source and drain regions with an inwardly tapered bottom end, in accordance with an embodiment of the present disclosure.

Figures 1A, 1B:
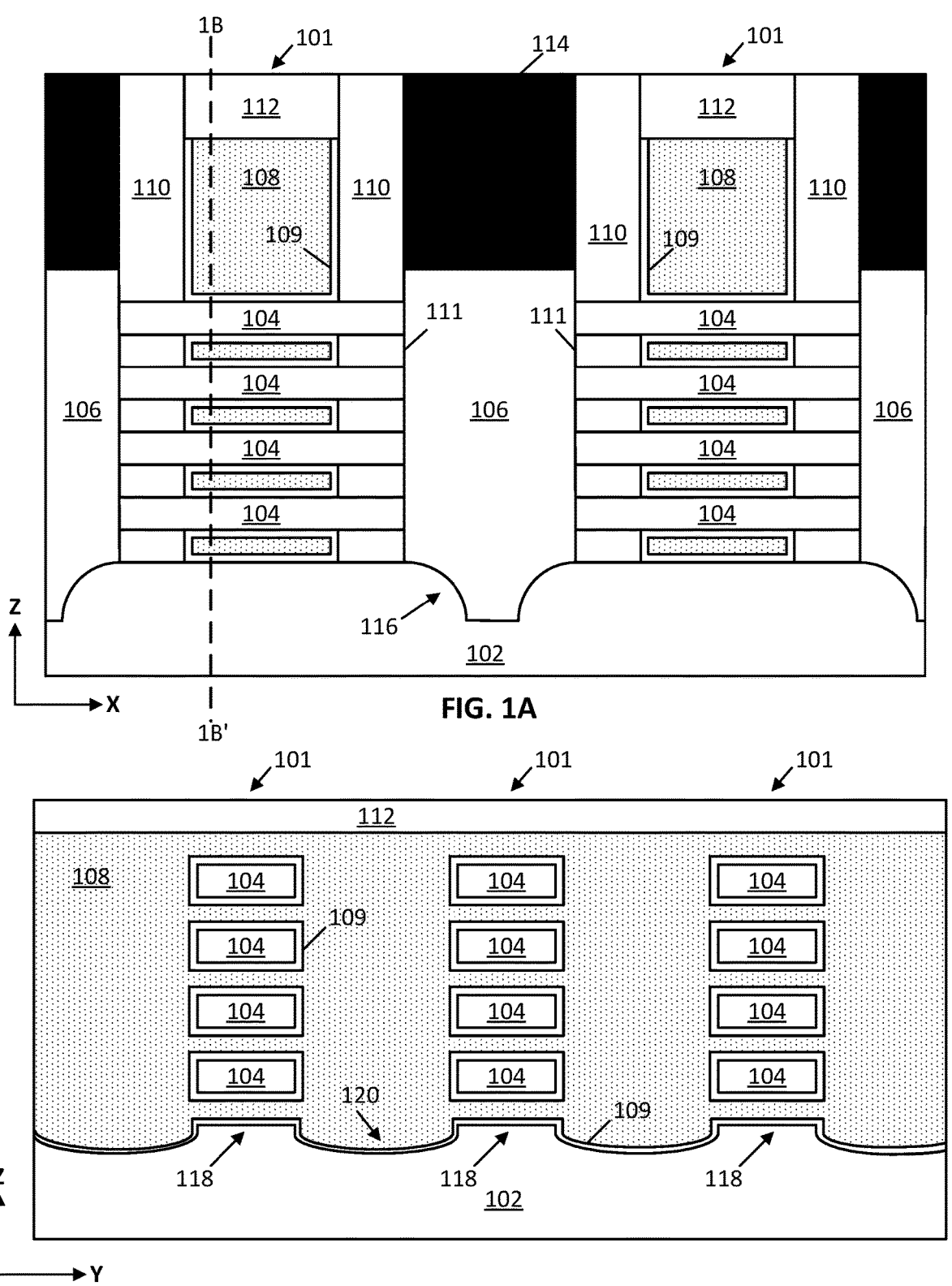
FIGS. 1A and 1B are different cross-sectional views of an integrated circuit that has source and drain regions with an inwardly tapered bottom end, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein to form an integrated circuit having source and/or drain regions with shaped bottom surfaces to reduce parasitic capacitance. In an example, the bottom portions of the source and/or drain regions may be etched from the backside to form inwardly tapered ends. The techniques can be used in any number of integrated circuit applications and are particularly useful with respect to logic and memory cells, such as those cells that use finFETs or gate-all-around transistors (e.g., ribbon-FETs and nanowire FETs). In one such example, an array of semiconductor devices each include a semiconductor region extending (e.g., in a first direction) from a source region to a drain region, with a gate structure extending (e.g., in a second direction perpendicular to the first direction) over the semiconductor region. According to some examples, a lower portion of the source and drain regions (e.g., a portion at least extending below the semiconductor region) has an inwardly tapered shape. The inward taper may be provided using a backside etching process on the lower portion of the source and drain regions. The tapered ends of the source and drain regions have an increased distance to the adjacent gate structures, thus reducing the parasitic capacitance. Numerous variations and embodiments will be apparent in light of this disclosure.

General Overview

As previously noted above, there remain a number of non-trivial challenges with respect to integrated circuit fabrication. In more detail, conductive structures such as gate structures, contacts, and diffusion regions (source and drain regions) become closely packed together as device density increases. In many cases, such structures are electrically isolated from one another using dielectric materials such as silicon dioxide or silicon nitride. However, this can form parasitic capacitors between these conductive materials, which can degrade the overall performance of the device. For example, parasitic capacitance between source and/or drain regions and the neighboring gate structure can reduce the switching speed of the transistor.

Thus, and in accordance with an embodiment of the present disclosure, techniques are provided herein to reduce the parasitic capacitance between source and/or drain regions and the neighboring gate structures of semiconductor devices. The semiconductor devices include a semiconductor region extending from a source region to a drain region along a first direction and a gate structure extending over the semiconductor region in a second direction different from the first direction. In an example, a backside etching technique is used to shape the bottom ends of the source and/or drain regions and increase the distance between the bottom ends of the source and/or drain regions and the adjacent gate structures. According to some embodiments, an isotropic semiconductor etching process is performed to create inwardly tapered bottom ends of the source and/or drain regions. The tapered surfaces may be observed along the first direction between neighboring semiconductor devices. The backside etching process may be controlled to remove portions of the bottom ends of the source and/or drain regions without removing too much of the source and/or drain regions between the semiconductor regions. A dielectric backfill material may be provided around the tapered bottom ends of the source and/or drain regions and adjacent to portions of the gate structures.

According to an embodiment, an integrated circuit includes a semiconductor region having one or more semiconductor nanoribbons extending from a source or drain region in a first direction, a gate structure extending over the semiconductor region in a second direction different from the first direction, and a dielectric layer adjacent to a portion of the gate structure below the semiconductor region and adjacent to a portion of the source or drain region below the semiconductor region. The portion of the source or drain region has an inwardly tapered end having a concave profile. The radius of curvature of the inwardly tapered end may depend on the etch parameters and can be adjusted depending on the desired final structure.

According to another embodiment, an integrated circuit includes a source or drain region of a semiconductor device with the source or drain region having a first portion adjacent to a semiconductor region of the semiconductor device and a second portion below the first portion, and a dielectric layer adjacent to the second portion of the source or drain region. The second portion of the source or drain region has an inwardly tapered end with a concave profile.

According to another embodiment, a method of forming an integrated circuit includes: forming a multilayer fin extending in a first direction over a substrate having a first section with first material layers alternating with second material layers, and a subfin beneath the first section; forming a first dielectric layer adjacent to the subfin; forming a sacrificial gate and spacers on sidewalls of the sacrificial gate, the sacrificial gate extending in a second direction over the multilayer fin, the second direction being different from the first direction; removing an exposed portion of the multilayer fin adjacent to the sacrificial gate and etching a recess through a portion of the subfin; forming a source or drain region from ends of the second material layers and within the recess; replacing the sacrificial gate with a gate structure; removing a portion of the substrate from the backside to expose a bottom surface of the subfin; etching the subfin and a bottom end of the source or drain region, such that the bottom end of the source or drain region takes on an inwardly tapered shape; and forming a second dielectric layer around the bottom end of the source or drain region.

The techniques can be used with any type of non-planar transistors, including finFETs (sometimes called double-gate transistors, or tri-gate transistors), or nanowire and nanoribbon transistors (sometimes called gate-all-around transistors), to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a replacement metal gate, or RMG, process), or any other gate formation process. Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of shaped bottom ends of the source and/or drain regions to increase the distance between the bottom ends of the source and/or drain regions and adjacent gate structures. In some examples, the bottom ends of the source and/or drain regions have an inwardly tapered shape.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," "top," "bottom," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

Architecture

FIGS. 1A and 1B are cross-sectional views of a portion of an integrated circuit that includes various semiconductor devices 101, in accordance with an embodiment of the present disclosure. Each of the semiconductor devices may be non-planar metal oxide semiconductor (MOS) transistors, such as tri-gate (e.g., finFET) or gate-all-around (GAA) transistors, although other transistor topologies and types could also benefit from the techniques provided herein. The examples herein illustrate semiconductor devices with a GAA structure (e.g., having nanoribbons, nanowires, or nanosheets that extend between source and drain regions). FIG. 1A illustrates a cross-section taken along a first direction (e.g., along the X-axis) with semiconductor regions extending between source and drain regions along the first direction while FIG. 1B illustrates a cross-section taken along a second direction (e.g., along the Y-axis) substantially orthogonal to the first direction with a gate structure extending over the semiconductor regions of one or more devices along the second direction. The cross section across the YZ plane in FIG. 1B may be taken through plane 1B-1B' as illustrated by the dashed line in FIG. 1A.

The semiconductor material used in each of the semiconductor devices may be formed from a semiconductor substrate. In the illustrated example, the semiconductor substrate has been removed and replaced with a base dielectric layer 102 using a backside removal process, as will be discussed in more detail herein.

The one or more semiconductor regions of the devices may include fins that can be, for example, native to the substrate (formed from the substrate itself), such as silicon fins etched from a bulk silicon substrate. Alternatively, the fins can be formed of material deposited onto the substrate. In one such example case, a blanket layer of silicon germanium (SiGe) can be deposited onto a silicon substrate, and then patterned and etched to form a plurality of SiGe fins extending from that substrate. In still other embodiments, the fins include alternating layers of material (e.g., alternating layers of silicon and SiGe) that facilitates forming of nanowires and nanoribbons during a gate forming process where one type of the alternating layers is selectively etched away so as to liberate the other type of alternating layers within the channel region, so that a gate-all-around process can then be carried out. Again, the alternating layers can be blanket deposited and then etched into fins or deposited into fin-shaped trenches.

Base dielectric layer 102 may include any suitable dielectric material, such as silicon dioxide, silicon nitride, or silicon oxynitride. According to some embodiments, backside interconnect structures, such as metal layers for routing power or logic signals, may be formed on the lower surface of base dielectric layer 102, or at least beneath base dielectric layer 102. In some examples, base dielectric layer 102 represents various dielectric materials that may have been deposited at different times, but together form an electrically insulating layer.

Each semiconductor device 101 includes one or more semiconductor regions, such as one or more nanoribbons 104 extending between epitaxial source and drain regions 106 in the first direction. One or more nanoribbons 104 may include any suitable semiconductor material, such as silicon, germanium, or silicon germanium. Any number of nanoribbons 104 may be provided within a given semiconductor device 101, although four are used here for each device as an example.

A gate structure that includes gate electrode 108 and a gate dielectric 109 extends over the one or more semiconductor regions of a given semiconductor device 101 in a second direction to form the transistor gate. Gate electrode 108 may represent any number of conductive layers and gate dielectric 109 may represent any number of dielectric layers. Gate electrode 108 may include any sufficiently conductive material such as a metal, metal alloy, or doped polysilicon. In some embodiments, gate electrode 108 includes one or more workfunction metals around the one or more semiconductor regions. In some embodiments, p-channel devices include a workfunction metal having titanium around its one or more semiconductor regions and n-channel devices include a workfunction metal having tungsten around its one or more semiconductor regions. Gate electrode 108 may also include a fill metal or other conductive material around the workfunction metals to provide the whole gate electrode structure. Gate dielectric 109 may include any suitable gate dielectric material(s). In some embodiments, gate dielectric 109 includes a layer of native oxide material (e.g., silicon oxide) on the nanoribbons 104 or other semiconductor regions, and a layer of high-k dielectric material (e.g., hafnium oxide) on the native oxide. According to some embodiments, spacer structures 110 are present along the sidewalls of the gate structures. Spacer structures 110 may be any suitable dielectric material, such as silicon nitride, and provide separation between a given gate structure and the adjacent source or drain region 106. Spacer structures 110 may run along the gate structure sidewalls in the second direction and extend the entire height of the gate structure (e.g., vertically along the Z-axis). Inner spacers 111 may also be provided between nanoribbons 104 to isolate source or drain regions 106 from gate electrodes 108. According to some embodiments, inner spacers 111 may include the same dielectric material as spacer structures 110.

According to some embodiments, a dielectric cap layer 112 may run lengthwise along the second direction on a top surface of gate electrode 108. Cap layer 112 may include the same dielectric material as spacer structures 110, in some examples.

According to some embodiments, one or more conductive contacts 114 are on corresponding source and drain regions 106. One or more conductive contacts 114 may be sandwiched between adjacent spacer structures 110. Any of one or more conductive contacts 114 can include any suitable conductive material, such as tungsten, molybdenum, or other metals.

According to some embodiments, a bottom portion 116 of source and drain regions 106 has an inwardly tapered shape. In some examples, the inwardly tapered shape has a semi-circular cross-section across a plane extending vertically (along the Z-axis) and along the first direction (e.g., X-axis). In some examples, the inwardly tapered shape is defined by a concave curvature at the bottom portion 116 of source and drain regions 106. In any case, an etching process is performed to shape the bottom portion 116 of source and drain regions 106, as discussed in more detail herein.

The gate structure, which includes gate electrode 108 and gate dielectric 109, may extend below the top surface of dielectric ridges 118 beneath semiconductor nanoribbons 104, according to some embodiments. Dielectric ridges 118 remain after removal of subfin regions from beneath semiconductor nanoribbons 104 and subsequent formation of base dielectric layer 102. According to some embodiments, the gate structure includes valleys 120 that stretch along the second direction between adjacent dielectric ridges 118 and that extend below a top surface of dielectric ridges 118. These extensions of the gate structure into base dielectric layer 102 bring the gate structure into close proximity with the bottom portion 116 of source and drain regions 106. Accordingly, the inwardly tapered ends of source and drain regions 106 minimize or at least reduce the parasitic capacitance by increasing the distance between the ends of source and drain regions 106 and valleys 120 of the gate structures. Furthermore, the etching of the bottom portion 116 of source and drain regions 106 does not appreciably impact the performance of the transistor as the bottom portion 116 of source and drain regions 106 is far from nanoribbons 104 and does not contribute (or contributes very minorly) to the formation of the conductive channel.

Fabrication Methodology

FIGS. 2A-13A and 2B-13B include cross-sectional views that collectively illustrate an example process for forming an integrated circuit configured with source and/or drain regions having an inwardly tapered bottom end, in accordance with an embodiment of the present disclosure. FIGS. 2A-13A represent a cross-sectional view taken across the XZ plane similar to FIG. 1A, while FIGS. 2B-13B represent a cross-sectional view taken across the YZ plane similar to FIG. 1B. Each set of figures sharing the same letter shows an example structure that results from the process flow up to that point in time, so the depicted structure evolves as the process flow continues, culminating in the structure shown in FIGS. 13A and 13B, which is similar to the structure shown in FIGS. 1A and 1B. Such a structure may be part of an overall integrated circuit (e.g., such as a processor or memory chip) that includes, for example, digital logic cells and/or memory cells and analog mixed signal circuitry. Thus, the illustrated integrated circuit structure may be part of a larger integrated circuit that includes other integrated circuitry not depicted. Example materials and process parameters are given, but the present disclosure is not intended to be limited to any specific such materials or parameters, as will be appreciated.

Figure 2A:
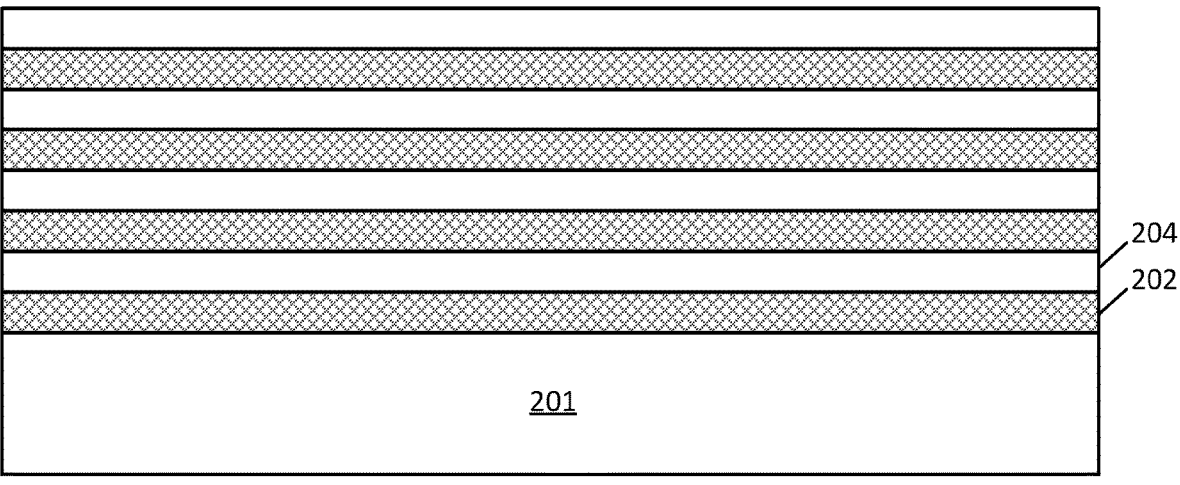
FIGS. 2A and 2B are cross-sectional views that illustrate one stage in an example process for forming an integrated circuit configured with source and drain regions having an inwardly tapered bottom end, in accordance with an embodiment of the present disclosure.
Figure 2B:
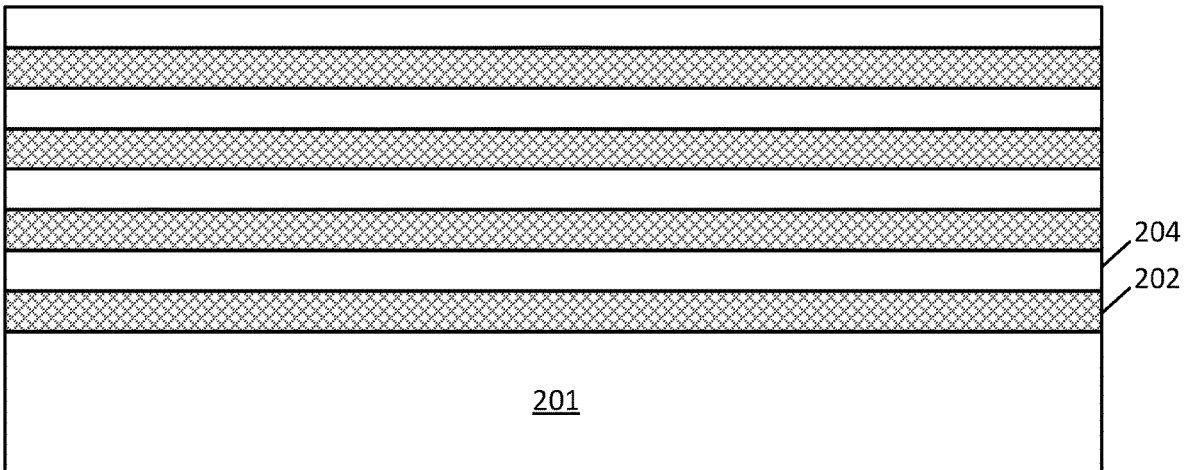

FIGS. 2A and 2B each illustrates a cross-sectional view taken through a substrate 201 having a series of material layers formed over the substrate, according to an embodiment of the present disclosure. Alternating material layers may be deposited over substrate 201 including sacrificial layers 202 alternating with semiconductor layers 204. The alternating layers are used to form GAA transistor structures. Any number of alternating sacrificial layers 202 and semiconductor layers 204 may be deposited over substrate 201.

Substrate 201 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, the substrate can be a semiconductor-on-insulator substrate having a desired semiconductor layer over a buried insulator layer (e.g., silicon over silicon dioxide). Alternatively, the substrate can be a multilayer substrate or superlattice suitable for forming nanowires or nanoribbons (e.g., alternating layers of silicon and SiGe, or alternating layers indium gallium arsenide and indium phosphide). Any number of substrates can be used.

According to some embodiments, semiconductor layers 204 have a different material composition than sacrificial layers 202. In some embodiments, semiconductor layers 204 are silicon germanium (SiGe) while sacrificial layers 202 include a semiconductor material suitable for use as a nanoribbon such as silicon (Si), SiGe, germanium, or III-V materials like indium phosphide (InP) or gallium arsenide (GaAs). In examples where SiGe is used in each of semiconductor layers 204 and in sacrificial layers 202, the germanium concentration is different between semiconductor layers 204 and sacrificial layers 202. For example, semiconductor layers 204 may include a higher germanium content compared to sacrificial layers 202. In some examples, sacrificial layers 202 may be doped with either n-type dopants (to produce a p-channel transistor) or p-type dopants (to produce an n-channel transistor).

While dimensions can vary from one example embodiment to the next, the thickness of each semiconductor layer 204 may be between about 5 nm and about 20 nm. In some embodiments, the thickness of each semiconductor layer 204 is substantially the same (e.g., within 1-2 nm). The thickness of each of sacrificial layers 202 may be about the same as the thickness of each semiconductor layer 204 (e.g., about 5-20 nm). Each of semiconductor layers 204 and sacrificial layers 202 may be deposited using any known material deposition technique, such as chemical vapor deposition (CVD), plasma-enhanced chemical vapor deposition (PECVD), physical vapor deposition (PVD), or atomic layer deposition (ALD), or epitaxial growth.

Figure 3A:
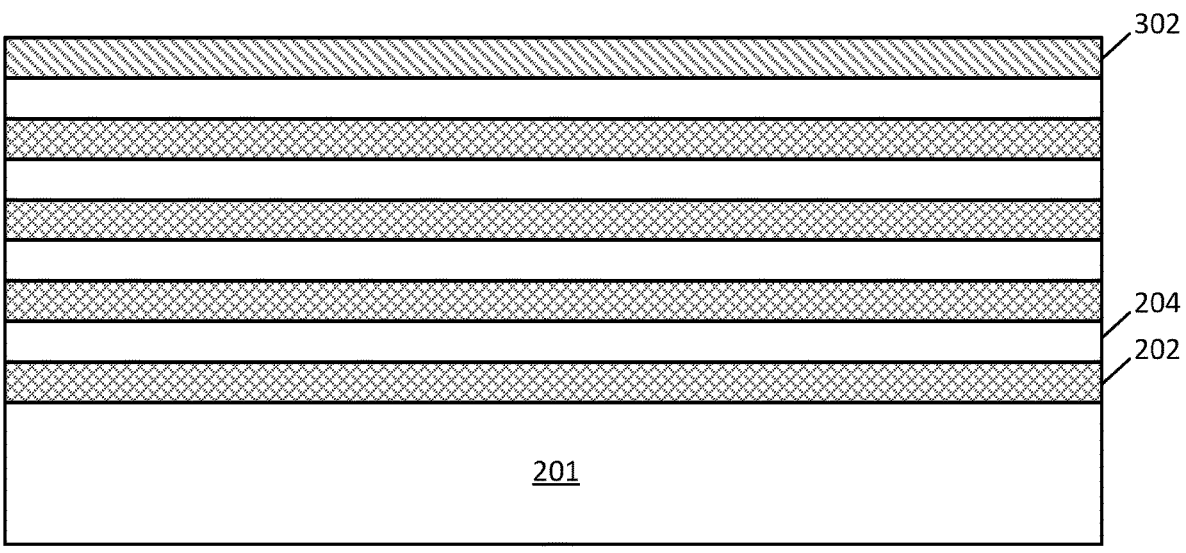
FIGS. 3A and 3B are cross-sectional views that illustrate another stage in an example process for forming an integrated circuit configured with source and drain regions having an inwardly tapered bottom end, in accordance with an embodiment of the present disclosure.
Figure 3B:
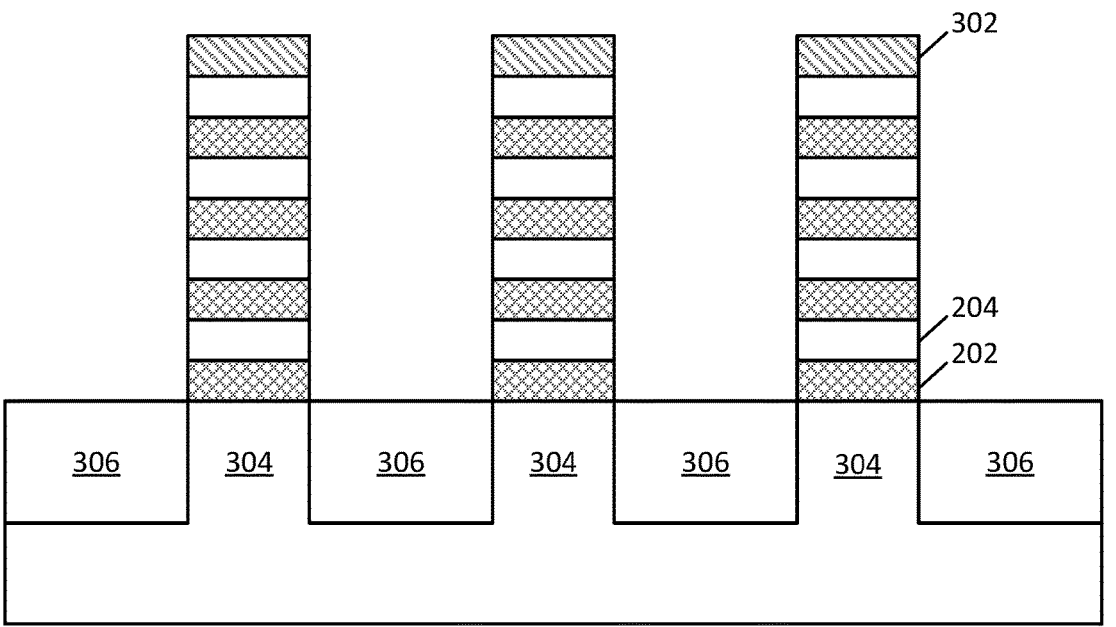

FIGS. 3A and 3B depict the cross-section views of the structure shown in FIGS. 2A and 2B, respectively, following the formation of a cap layer 302 and the subsequent formation of fins beneath cap layer 302, according to an embodiment. Cap layer 302 may be any suitable hard mask material such as a carbon hard mask (CHM) or silicon nitride. Cap layer 302 is patterned into rows to form corresponding rows of fins from the alternating layer stack of sacrificial layers 202 and semiconductor layers 204. Cap layer 302 extends along the top of each fin in a first direction, as seen in FIG. 3A.

According to some embodiments, an anisotropic etching process through the layer stack continues into at least a portion of substrate 201. Portions of substrate 201 beneath the fins are not etched and yield subfin regions 304. The etched portion of substrate 201 may be filled with a dielectric fill 306 that acts as shallow trench isolation (STI) between adjacent fins. Dielectric fill 306 may be any suitable dielectric material such as silicon oxide. Subfin regions 304 represent remaining portions of substrate 201 between dielectric fill 306, according to some embodiments.

Figure 4A:
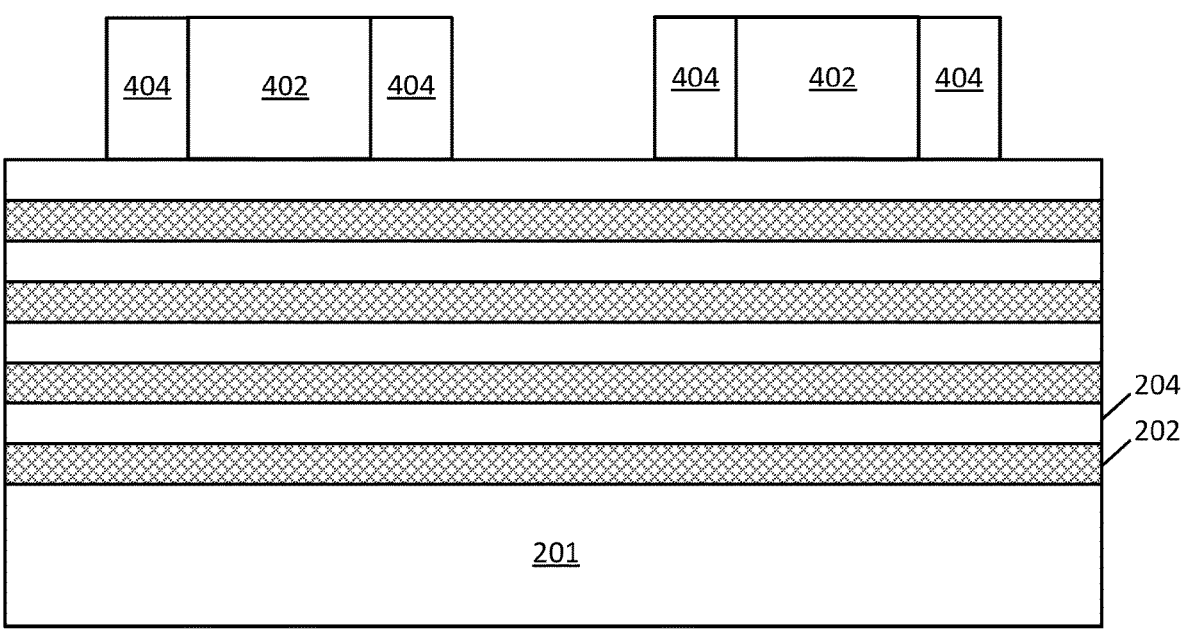
FIGS. 4A and 4B are cross-sectional views that illustrate another stage in an example process for forming an integrated circuit configured with source and drain regions having an inwardly tapered bottom end, in accordance with an embodiment of the present disclosure.
Figure 4B:
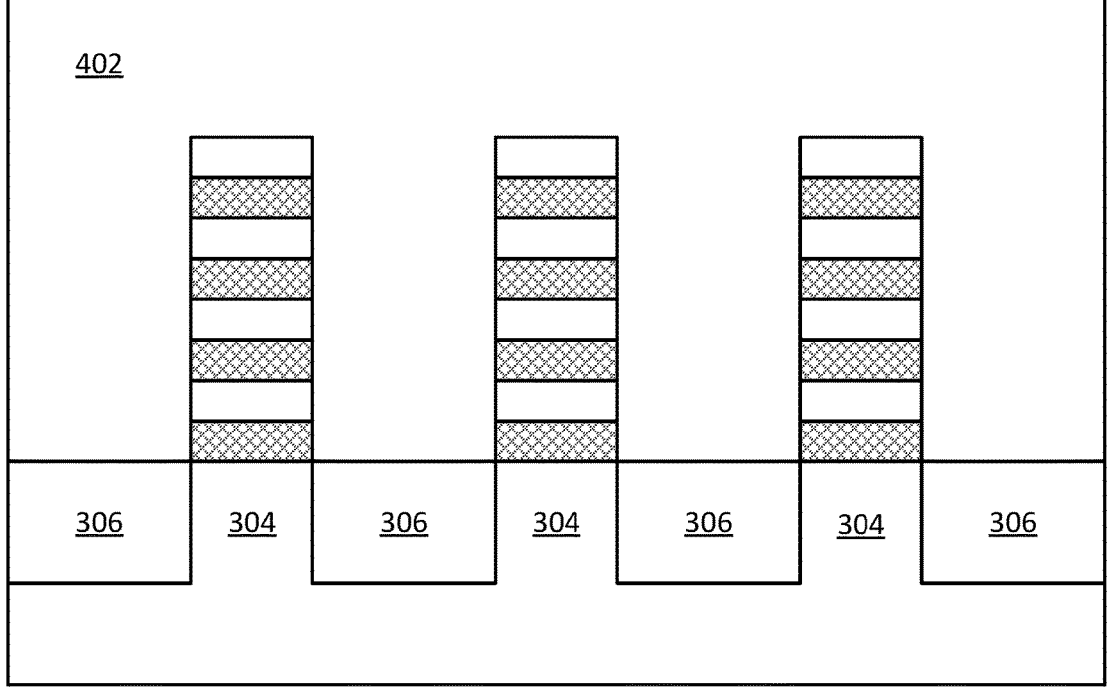

FIGS. 4A and 4B depict cross-section views of the structures shown in FIGS. 3A and 3B following the formation of sacrificial gates 402, according to some embodiments. A gate masking layer may first be patterned in strips that extend orthogonally across each of the fins (e.g., in a second direction) in order to form corresponding sacrificial gates 402 in strips beneath the gate masking layers. Afterwards, the gate masking layers may be removed or may remain as a cap layer above each sacrificial gate 402. According to some embodiments, the sacrificial gate material is removed in all areas not protected by the gate masking layers. Sacrificial gate 402 may be any suitable material that can be selectively removed without damaging the semiconductor material of the fins. In some examples, sacrificial gate 402 includes polysilicon.

According to some embodiments, spacer structures 404 are formed along the sidewalls of sacrificial gates 402. Spacer structures 404 may be deposited and then etched back such that spacer structures 404 remain mostly only on sidewalls of any exposed structures. Spacer structures 404 may also be formed along sidewalls of any portions of exposed fins over dielectric fill 306. Such sidewall spacers on the fins can be removed during later processing when forming the source and drain regions. According to some embodiments, spacer structures 404 may be any suitable dielectric material, such as silicon nitride, silicon carbon nitride, or silicon oxycarbonitride. In one such embodiment, spacer structures 404 comprise a nitride and dielectric fill 306 comprises an oxide, so as to provide a degree of etch selectivity during final gate processing. Other etch selective dielectric schemes (e.g., oxide/carbide, carbide/nitride) can be used as well for spacer structures 404 and dielectric fill 306. In other embodiments, spacer structures 404 and dielectric fill 306 are compositionally the same or otherwise similar, where etch selectivity is not employed.

Figure 5A:
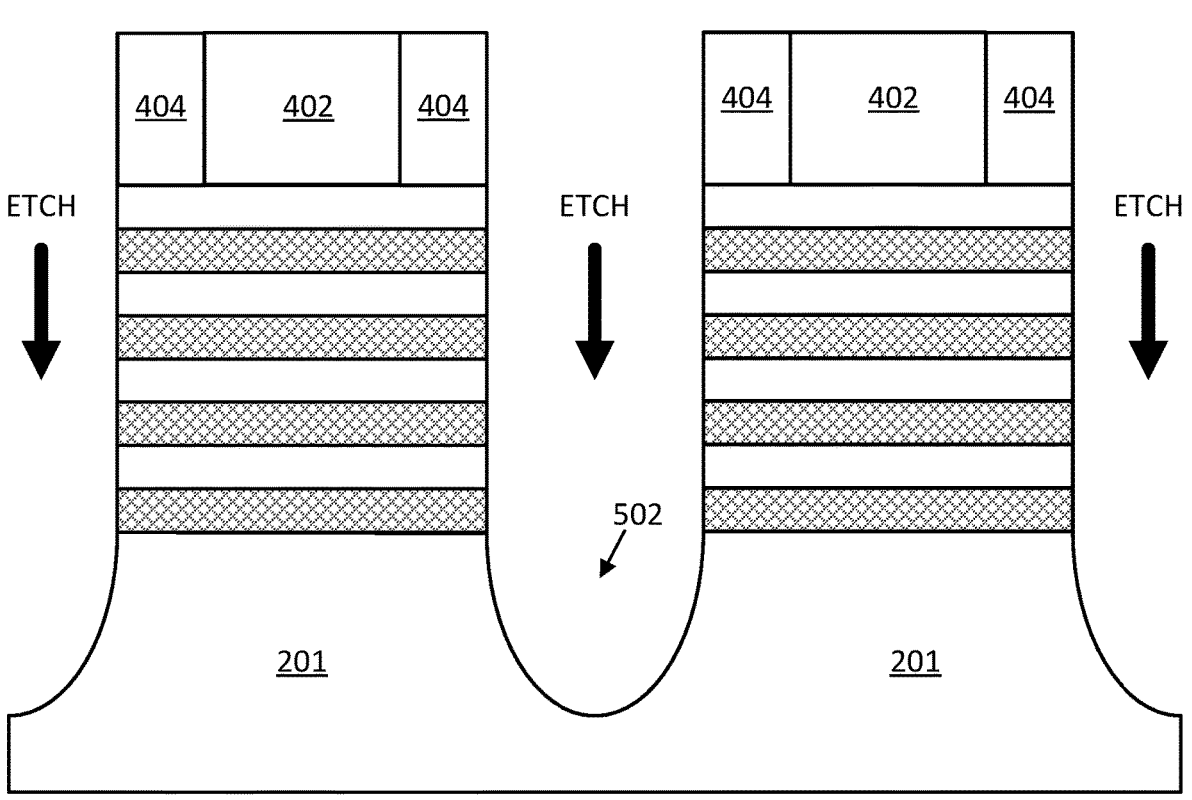
FIGS. 5A and 5B are cross-sectional views that illustrate another stage in an example process for forming an integrated circuit configured with source and drain regions having an inwardly tapered bottom end, in accordance with an embodiment of the present disclosure.
Figure 5B:
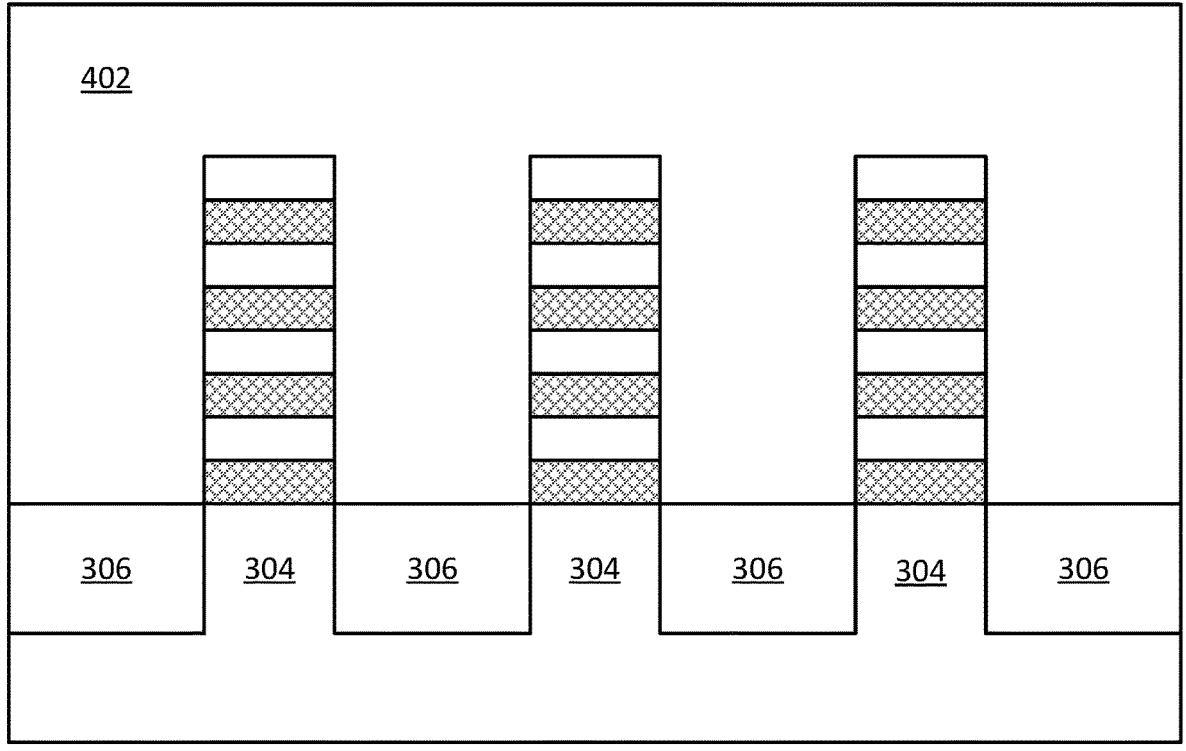

FIGS. 5A and 5B depict cross-section views of the structures shown in FIGS. 4A and 4B following the removal of exposed portions of the fins not protected by sacrificial gates 402 and spacer structures 404, according to some embodiments. The exposed fin portions may be removed using any anisotropic etching process, such as reactive ion etching (RIE). The removal of the exposed fin portions creates source and drain trenches that alternate with gate trenches (currently filled with sacrificial gates 402) along the first direction, according to some embodiments. In some embodiments, the gate trenches extend into at least a portion of substrate 201 to form recesses 502. In some examples, recesses 502 extend along an entire thickness of dielectric fill 306. A bottom surface of recesses 502 may be curved or tapered due to the mechanics of the etching process.

Figure 6A:
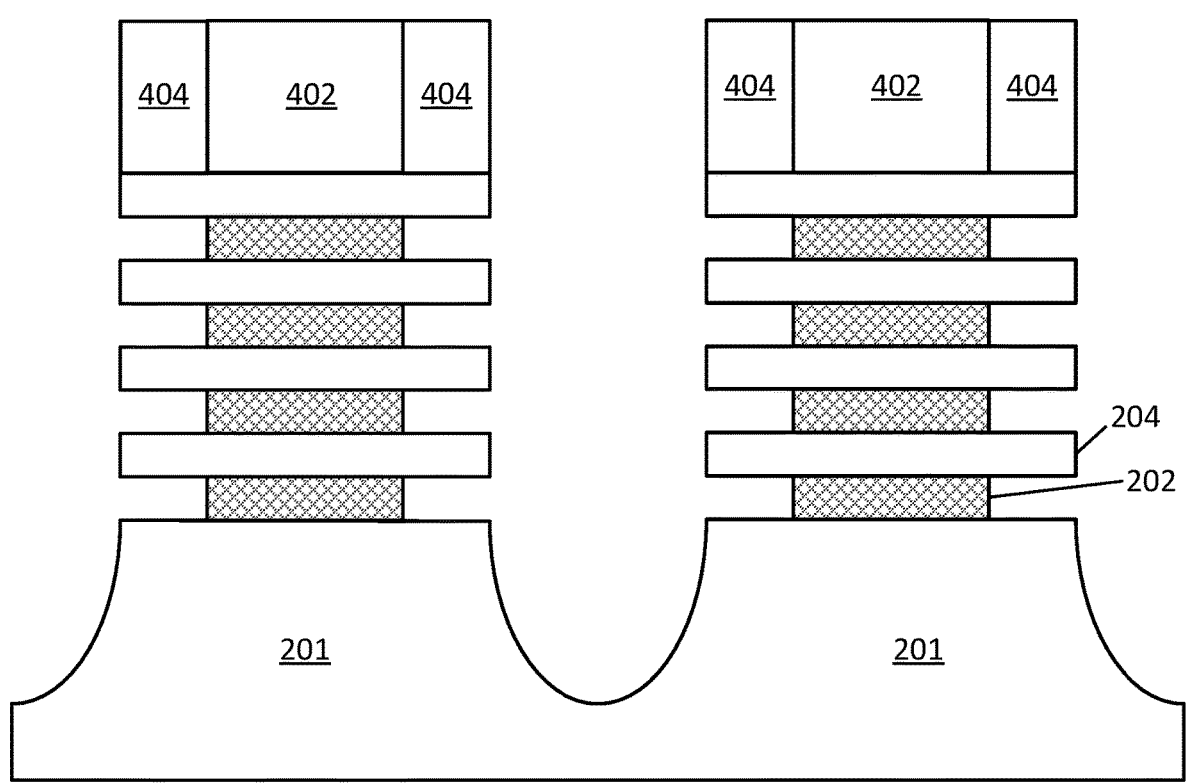
FIGS. 6A and 6B are cross-sectional views that illustrate another stage in an example process for forming an integrated circuit configured with source and drain regions having an inwardly tapered bottom end, in accordance with an embodiment of the present disclosure.
Figure 6B:
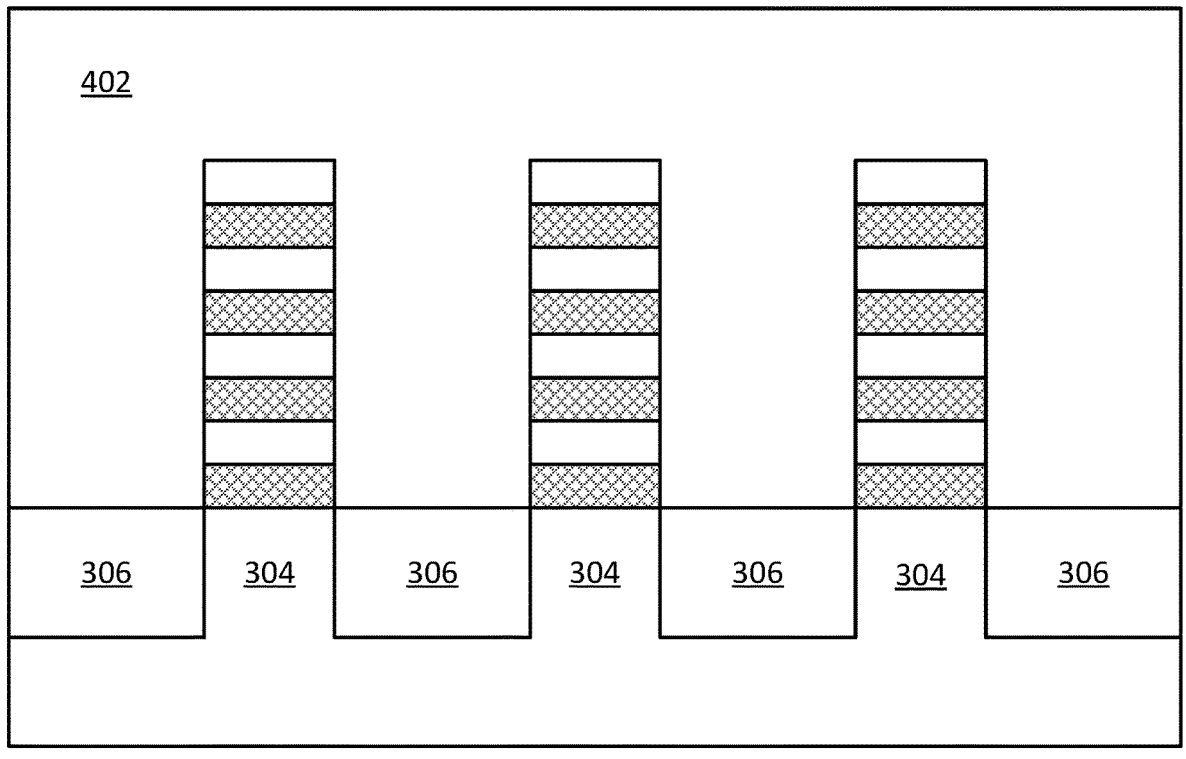

FIGS. 6A and 6B depict cross-section views of the structures shown in FIGS. 5A and 5B following the removal of portions of sacrificial layers 202, according to an embodiment of the present disclosure. An isotropic etching process may be used to selectively recess the exposed ends of each sacrificial layer 202 (e.g., while etching comparatively little of semiconductor layers 204).

Figure 7A:
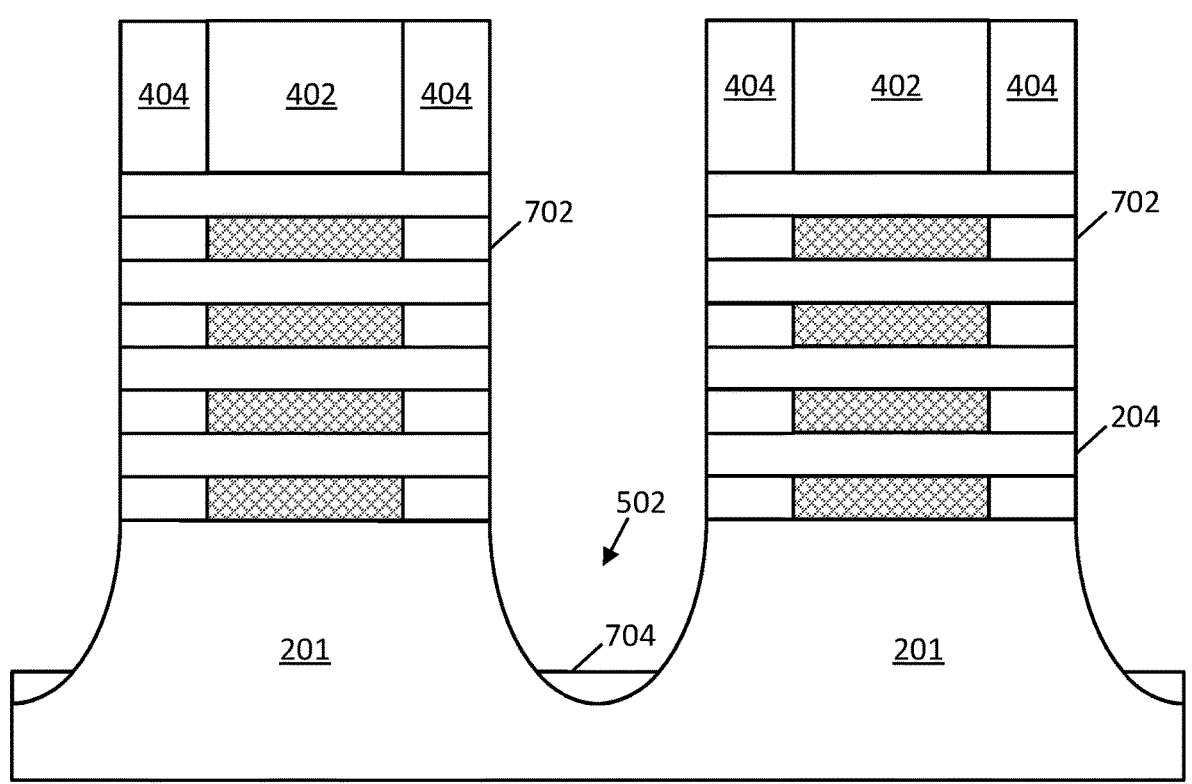
FIGS. 7A and 7B are cross-sectional views that illustrate another stage in an example process for forming an integrated circuit configured with source and drain regions having an inwardly tapered bottom end, in accordance with an embodiment of the present disclosure.
Figure 7B:
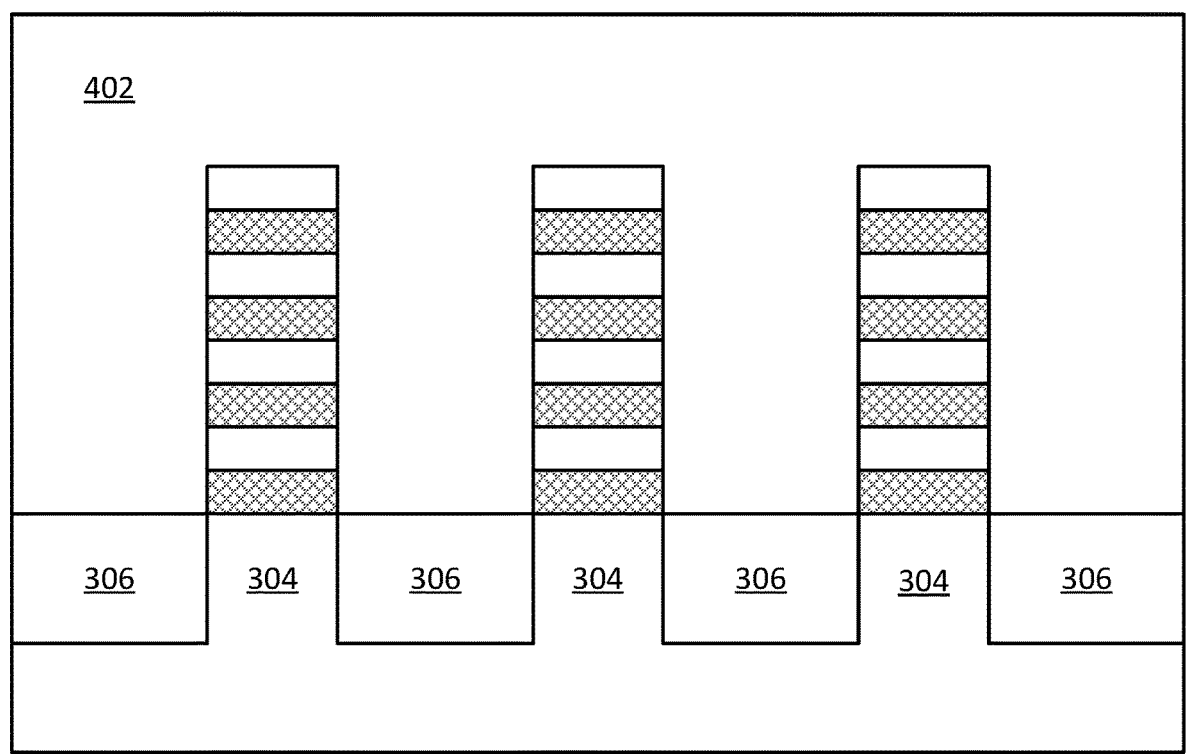

FIGS. 7A and 7B depict cross-section views of the structures shown in FIGS. 6A and 6B following the formation of internal spacers 702, according to an embodiment of the present disclosure. Internal spacers 702 may have a material composition that is similar to or the exact same as spacer structures 404. Accordingly, internal spacers 702 may be any suitable dielectric material that exhibits high etch selectively to semiconductor materials such as silicon and/or silicon germanium. Internal spacers 702 may be, for example, conformally deposited over the sides of the fin structure using a conformal deposition process like CVD or ALD and then etched back using an isotropic etching process to expose the ends of semiconductor layers 204. According to some embodiments, internal spacers 702 have a similar width (e.g., along the first direction) to spacer structures 404.

According to some embodiments, the dielectric material used to form internal spacers 702 also collects at the bottom of recesses 502 as a dielectric plug 704. During removal of excess portions of dielectric material to form internal spacers 702 and expose ends of semiconductor layers 204, some portions of the dielectric material at the bottom of recesses 502 may not be removed. Accordingly, dielectric plug 704 may include the same dielectric material as internal spacers 702.

Figure 8A:
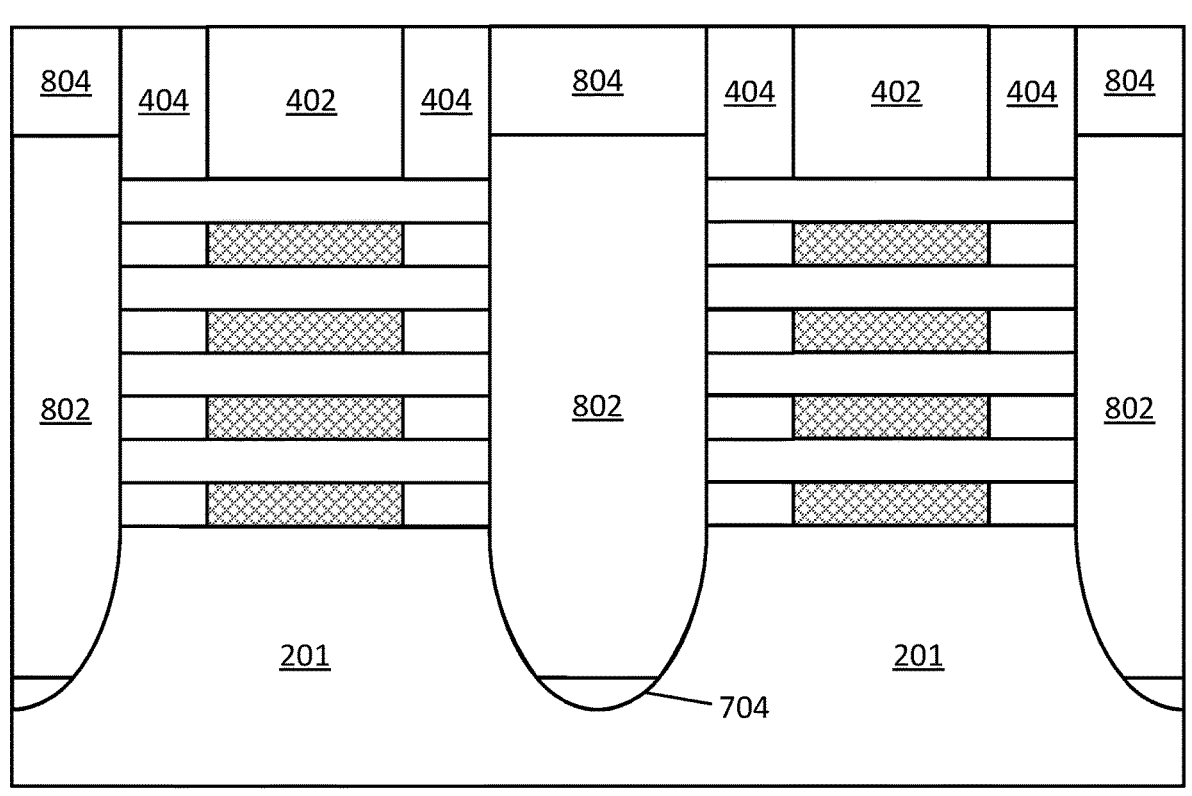
FIGS. 8A and 8B are cross-sectional views that illustrate another stage in an example process for forming an integrated circuit configured with source and drain regions having an inwardly tapered bottom end, in accordance with an embodiment of the present disclosure.
Figure 8B:
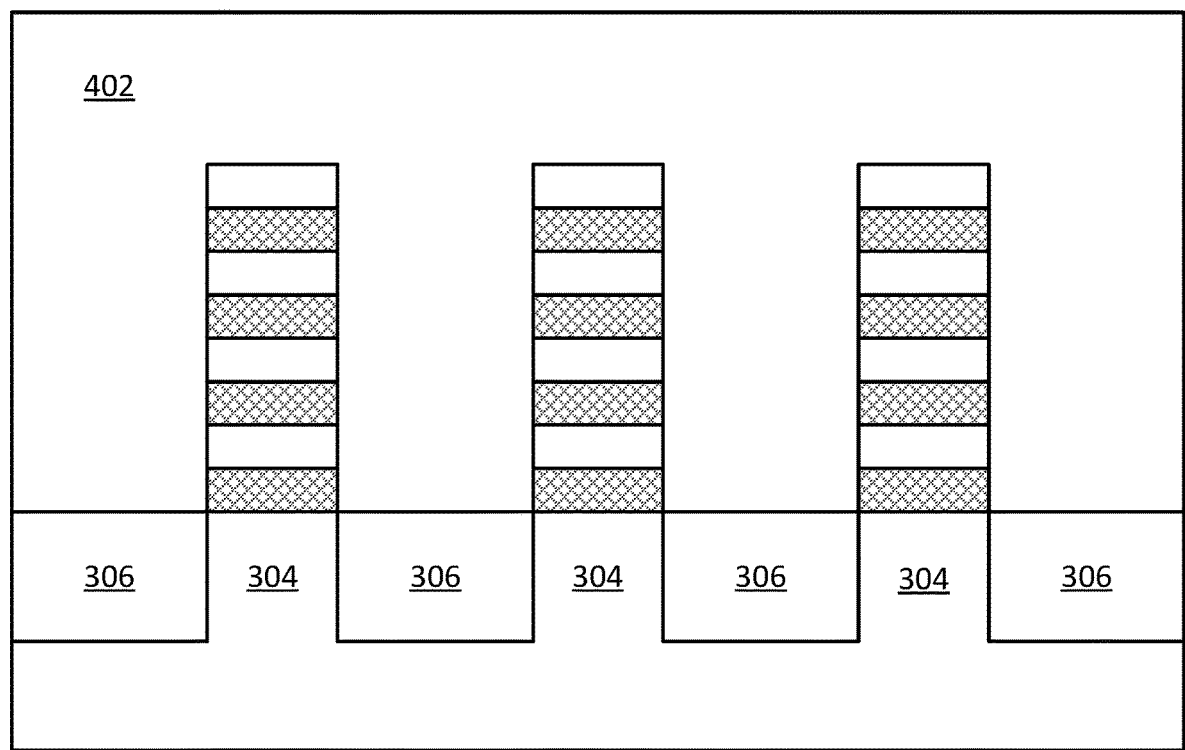

FIGS. 8A and 8B depict cross-section views of the structure shown in FIGS. 7A and 7B, respectively, following the formation of source and drain regions 802 within the source/drain trenches, according to some embodiments. Source and drain regions 802 may be formed in the areas that had been previously occupied by the exposed fins between spacer structures 404. According to some embodiments, source and drain regions 802 are epitaxially grown from the exposed semiconductor material at the ends of semiconductor layers 204, and may also grow from the exposed substrate 201 within recesses 502. In some example embodiments, source and drain regions 802 are NMOS source and drain regions (e.g., epitaxial silicon) or PMOS source and drain regions (e.g., epitaxial SiGe). In some examples, source and drain regions 802 are formed on dielectric plug 704 at the bottom of the source/drain trenches.

According to some embodiments, a dielectric fill 804 is provided at least on a top surface of source and drain regions 802. In some examples, dielectric fill 804 also occupies a remaining volume within the source/drain trench around and over source and drain regions 802. Dielectric fill 804 may be any suitable dielectric material, such as silicon dioxide. In some examples, dielectric fill 804 extends up to and planar with a top surface of spacer structures 404 (e.g., following a polishing procedure).

Figure 9A:
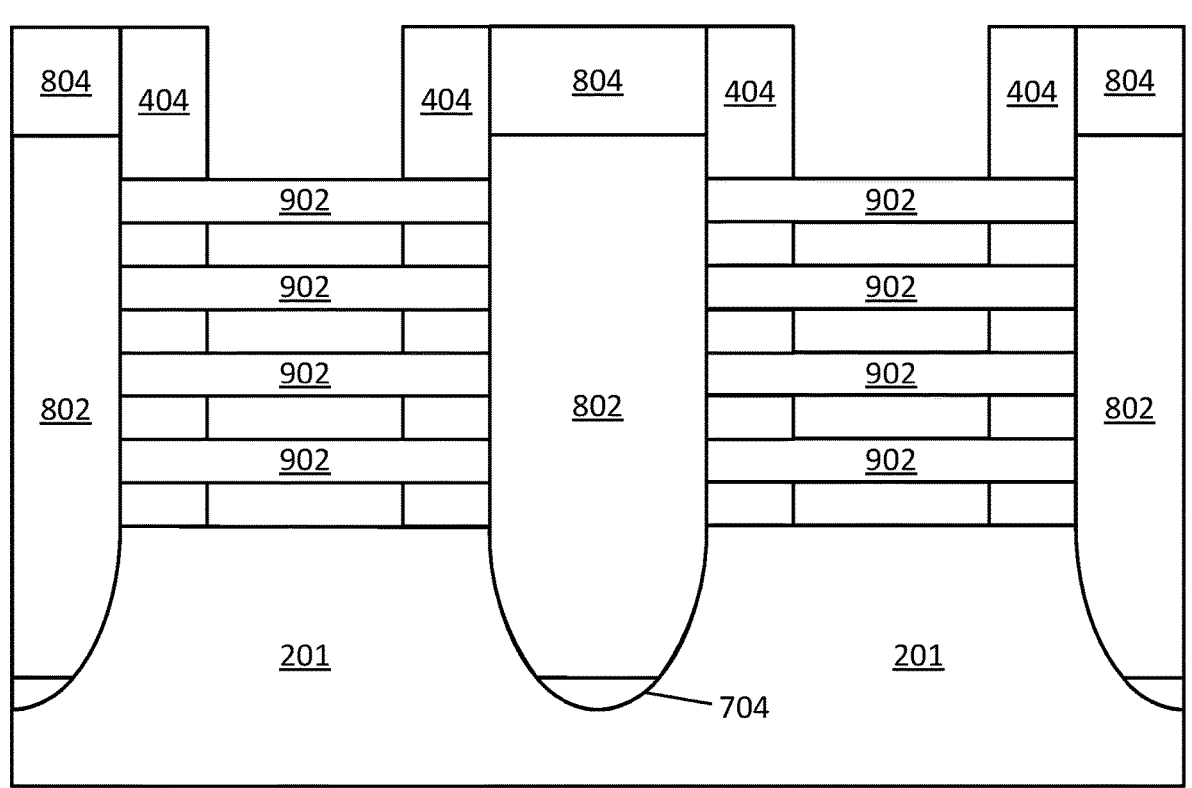
FIGS. 9A and 9B are cross-sectional views that illustrate another stage in an example process for forming an integrated circuit configured with source and drain regions having an inwardly tapered bottom end, in accordance with an embodiment of the present disclosure.
Figure 9B:
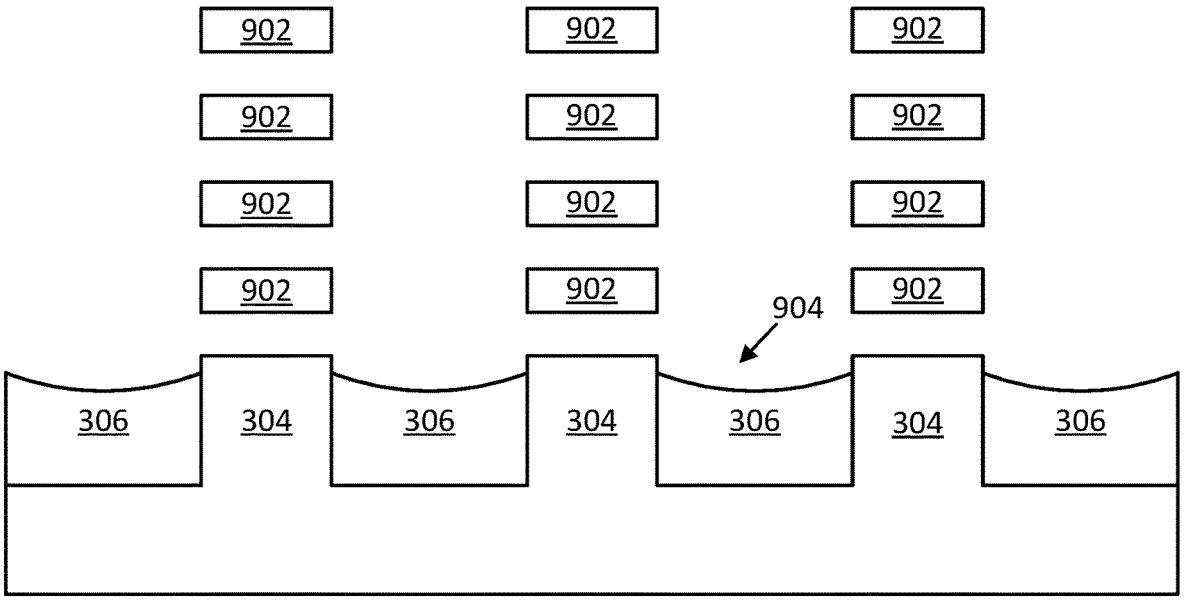

FIGS. 9A and 9B depict cross-section views of the structure shown in FIGS. 8A and 8B, respectively, following the removal of sacrificial gates 402 and sacrificial layers 202, according to some embodiments. In examples where gate masking layers are still present, they would be removed at this time. Once sacrificial gates 402 are removed, the fins extending between spacer structures 404 are exposed.

In the example where the fins include alternating semiconductor layers, sacrificial layers 202 are selectively removed to leave behind nanoribbons 902 that extend between corresponding source and drain regions 802. Each vertical set of nanoribbons 902 represents the semiconductor region of a different semiconductor device. It should be understood that nanoribbons 902 may also be nanowires or nanosheets. Sacrificial gates 402 and sacrificial layers 202 may be removed using the same isotropic etching process or different isotropic etching processes.

According to some embodiments, the removal of sacrificial gate 402 may cause a recess 904 in dielectric fill 306 between subfins 304. Accordingly, the top surface of dielectric fill 306 may be recessed below the top surface of subfins 304 and may have a curved profile that is thinner in the middle compared to the edges adjacent to subfins 304 along the second direction.

Figure 10A:
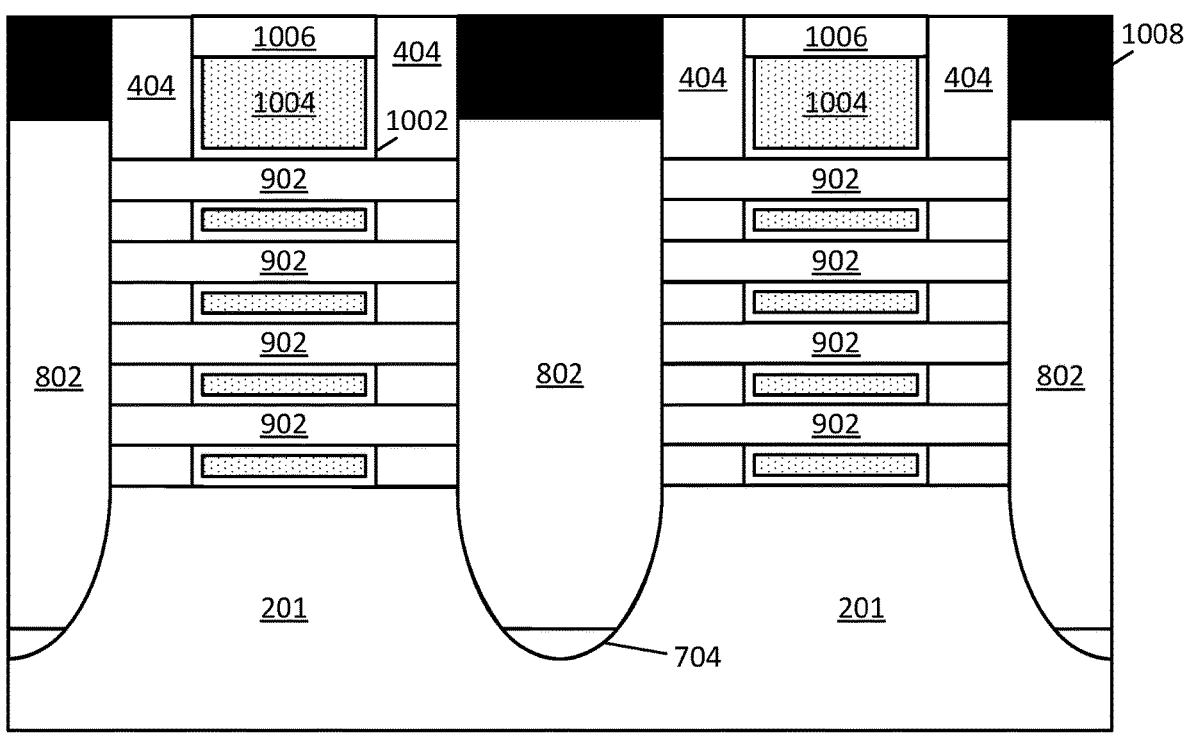
FIGS. 10A and 10B are cross-sectional views that illustrate another stage in an example process for forming an integrated circuit configured with source and drain regions having an inwardly tapered bottom end, in accordance with an embodiment of the present disclosure.
Figure 10B:
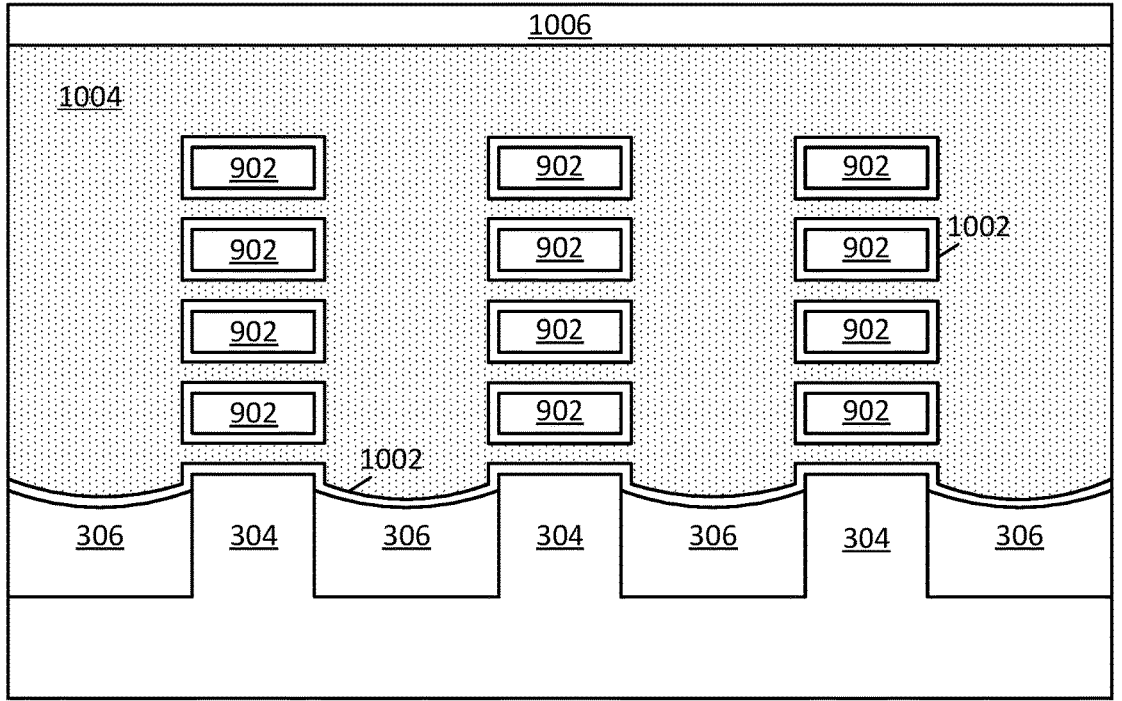

FIGS. 10A and 10B depict cross-section views of the structure shown in FIGS. 9A and 9B, respectively, following the formation of a gate structure, which includes a gate dielectric 1002 and a gate electrode 1004, and subsequent gate cap 1006, according to some embodiments. Gate dielectric 1002 may be first formed around nanoribbons 902 prior to the formation of gate electrode 1004, which may include one or more conductive layers. Gate dielectric 1002 may include any suitable dielectric material (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, gate dielectric 1002 includes a layer of hafnium oxide with a thickness between about 1 nm and about 5 nm. In some embodiments, gate dielectric 1002 may include one or more silicates (e.g., titanium silicate, tungsten silicate, niobium silicate, and silicates of other transition metals). In some cases, gate dielectric 1002 includes a first layer on nanoribbons 902, and a second layer on the first layer. The first layer can be, for instance, an oxide of the semiconductor material of nanoribbons 902 (e.g., silicon dioxide) and the second layer can be a high-k dielectric material (e.g., hafnium oxide).

The one or more conductive layers that make up gate electrode 1004 may be deposited using electroplating, electroless plating, CVD, PECVD, ALD, or PVD, to name a few examples. In some embodiments, gate electrode 1004 includes doped polysilicon, a metal, or a metal alloy. Example suitable metals or metal alloys include aluminum, tungsten, cobalt, molybdenum, ruthenium, titanium, tantalum, copper, and carbides and nitrides thereof. Gate electrode 1004 may include, for instance, a metal fill material along with one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates.

Gate cap 1006 may be formed by first recessing gate electrode 1004 and filling the recess with a dielectric material. The dielectric material may then be polished such that its top surface is substantially coplanar with a top surface of spacer structures 404.

According to some embodiments, portions of dielectric fill 804 at least on a top surface of source and drain regions 802 is removed and replaced with one or more conductive contacts 1008. A portion of dielectric fill 804 is recessed to expose at least the top surfaces of source and drain regions 802 and conductive contacts 1008 are formed within the recesses using any suitable metal deposition process. Conductive contacts 1008 may include any suitable conductive material or metal, such as tungsten or molybdenum.

Figures 11A, 11B:
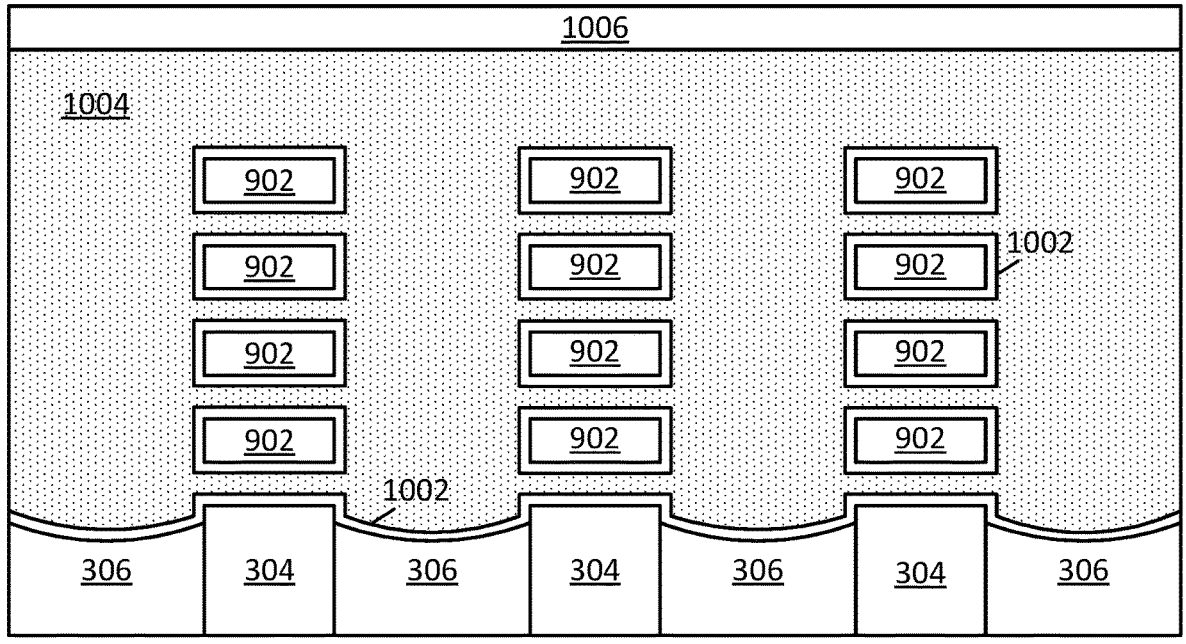
FIGS. 11A and 11B are cross-sectional views that illustrate another stage in an example process for forming an integrated circuit configured with source and drain regions having an inwardly tapered bottom end, in accordance with an embodiment of the present disclosure.

FIGS. 11A and 11B depict cross-section views of the structure shown in FIGS. 10A and 10B, respectively, following the removal of substrate 201 from the backside of the structure, according to some embodiments. Substrate 201 may be removed using any suitable etching and/or polishing process following the formation of any top-side interconnect structures. According to some embodiments, substrate 201 is removed such that a bottom surface of dielectric fill 306 is exposed on the backside of the structure. Accordingly, subfins 304 may also be exposed between dielectric fill 306. Depending on a depth of the source/drain trench, portions of dielectric plug 704 may also be exposed or removed during the removal of substrate 201. Note that there may be a natural mild convex taper at the bottom of source and drain regions 802 (as shown in FIG. 11A), which may result as a natural consequence of process limitations (e.g., a recess etch process to form source and drain trenches may not be able to form perfectly square corners at the bottom of the recess, so an epitaxial source or drain region grown in that recess may have a mild taper). Any such natural convex-like tapering is effectively not intentional and is not to be confused with the intentional concave-like tapering that is described herein, so as to increase the distance between a given source or drain region and a neighboring gate structure, such as further shown in the example of FIGS. 12A-B. Accordingly, note that the portion of the source or drain region 802 laterally between the gates structures has a width of W1. Further note that the portion of the source or drain region 802 that extends into the subfin 304 gradually tapers inward in a convex fashion, which does not meaningfully increase the distance between the source or drain region 802 and the neighboring gate structures (e.g., the width W1 of 802 is about the same as the width W2 of 802).

Figure 12A:
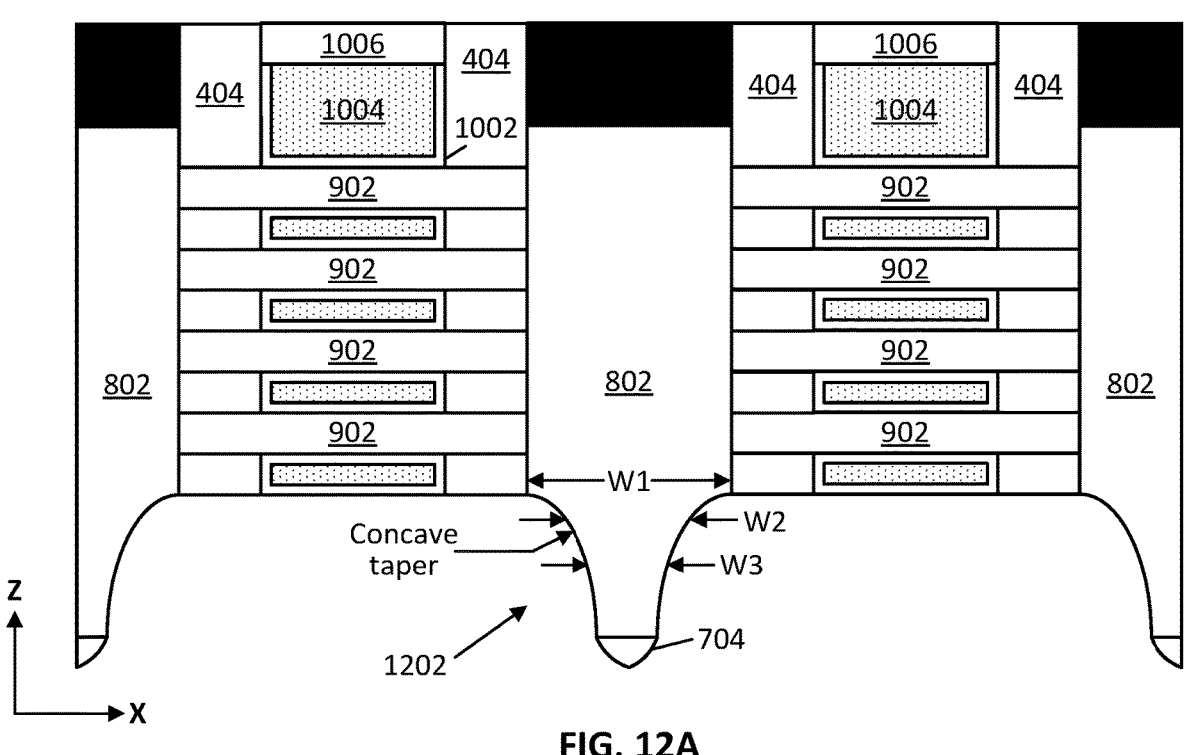
FIGS. 12A and 12B are cross-sectional views that illustrate another stage in an example process for forming an integrated circuit configured with source and drain regions having an inwardly tapered bottom end, in accordance with an embodiment of the present disclosure.
Figure 12B:
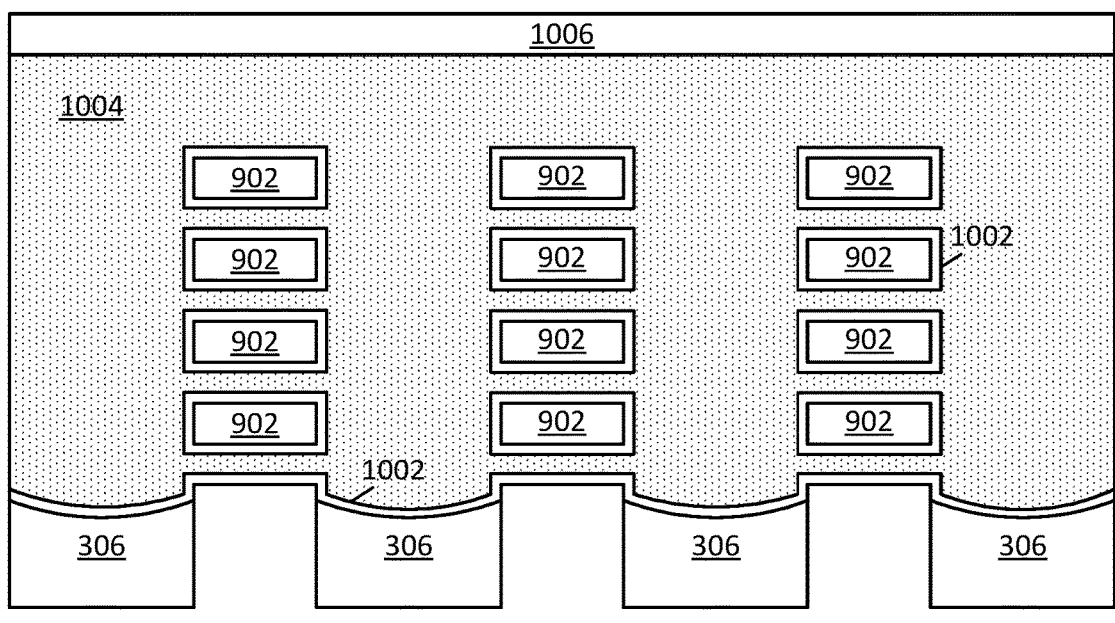

FIGS. 12A and 12B depict cross-section views of the structure shown in FIGS. 11A and 11B, respectively, following an etching process to remove subfins 304 and portions of source and drain regions 802, according to some embodiments. An isotropic etching process may be performed to remove the semiconductor material of subfins 304 and also remove portions of source and drain regions 802, while removing substantially little of dielectric plug 704 and gate dielectric 1002. During the removal of subfins 304, the underside of gate dielectric 1002 is exposed, according to some embodiments. The etching process may include bromine and hydrogen gases to provide the desired selectivity. In some examples, standard silicon isotropic etching procedures are used to etch both subfins 304 and source and drain regions 802. In some embodiments, the etching process may take between 5 and 10 seconds to remove subfins 304 and portions of source or drain regions 802.

According to some embodiments, a bottom end 1202 of source and drain regions 802 takes on an inwardly tapered shape as a result of the etching process. In some examples, bottom end 1202 includes a concave curvature along the XZ plane that tapers down to dielectric plug 704. The radius of curvature of the concave surface may depend on various factors, such as the etch parameters, geometry of the source and drain regions 802, and thickness/morphology of dielectric plug 704. Furthermore, note the severity of the concave-like tapering, relative to any natural convex-like tapering that might occur due to process limitations (such as shown in FIG. 11A). For instance, in this example case, note that the width W2 and W3 of source and drain regions 802 are considerably less than the width W1, so as to meaningfully increase the distance between the source or drain regions 802 and the neighboring gate structures. In some examples, the distance is increased by 1.5 times or more. Moreover, while each of the source and drain regions 802 is shown as having an inwardly tapered shape having a concave profile (rather than convex), in other examples, only a given source region (and not the corresponding drain region) may take on the inwardly tapered shape, or vice versa.

Figure 13A:
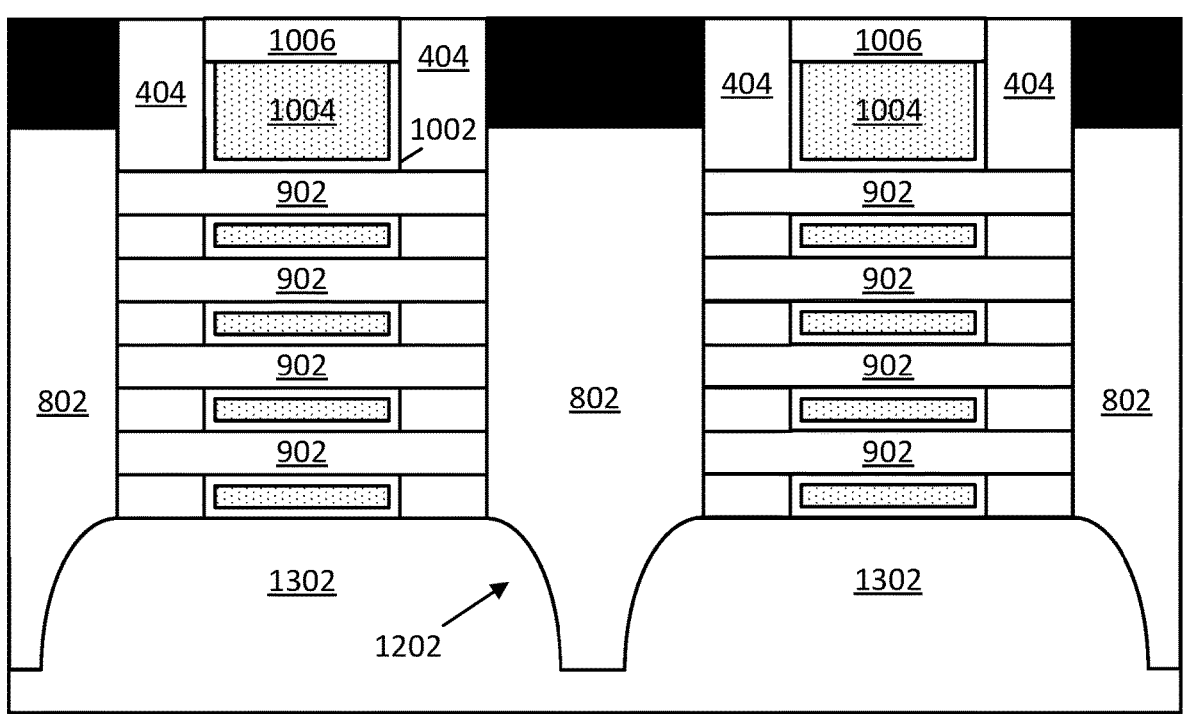
FIGS. 13A and 13B are cross-sectional views that illustrate another stage in an example process for forming an integrated circuit configured with source and drain regions having an inwardly tapered bottom end, in accordance with an embodiment of the present disclosure.
Figure 13B:
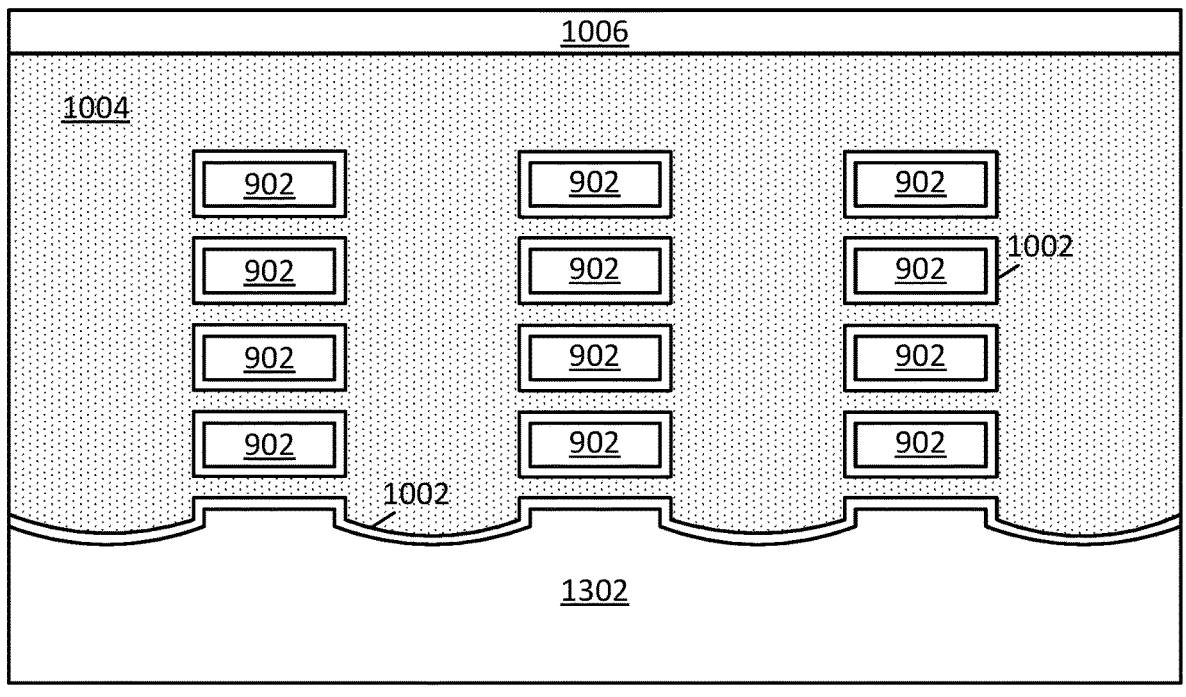

FIGS. 13A and 13B depict cross-section views of the structure shown in FIGS. 12A and 12B, respectively, following the formation of a base dielectric layer 1302, according to some embodiments. Base dielectric layer 1302 may include any suitable dielectric material, such as silicon nitride, silicon dioxide, or silicon oxynitride. According to some embodiments, base dielectric layer 1302 surrounds the bottom end 1202 of source and drain regions 802 and extends along the second direction beneath the gate structures. In some examples, base dielectric layer 1302 includes various dielectric materials that have been previous formed such as dielectric fill 306 and dielectric plug 704. In some examples, dielectric fill 306 and/or dielectric plug 704 are removed prior to the formation of base dielectric layer 1302. Any number of backside interconnect structures may be formed on a bottom surface of base dielectric layer 1302.

Figure 14:
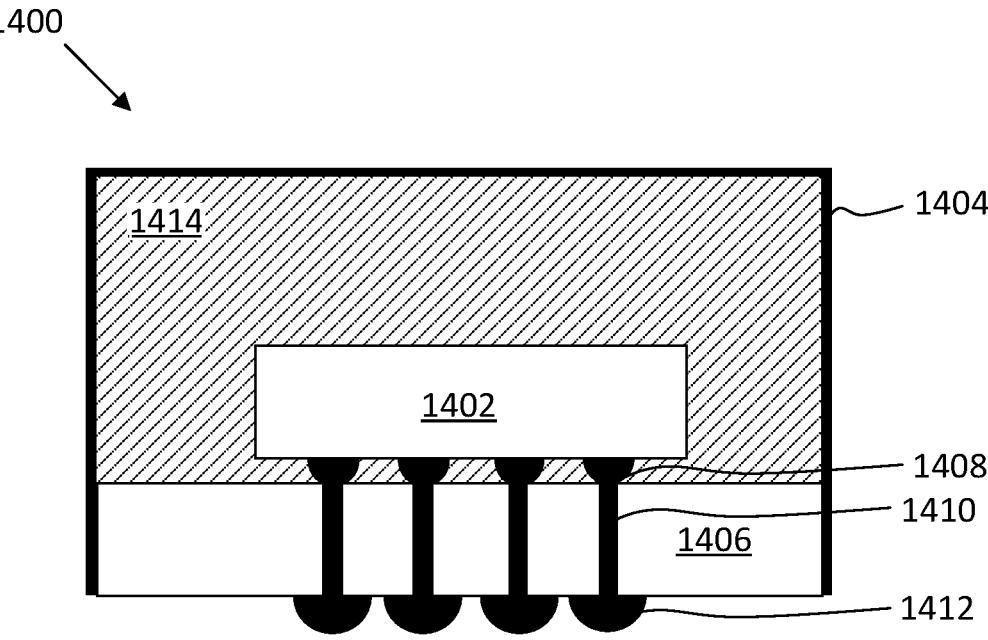
FIG. 14 illustrates a cross-sectional view of a chip package containing one or more semiconductor dies, in accordance with some embodiments of the present disclosure.

FIG. 14 illustrates an example embodiment of a chip package 1400, in accordance with an embodiment of the present disclosure. As can be seen, chip package 1400 includes one or more dies 1402. One or more dies 1402 may include at least one integrated circuit having semiconductor devices, such as any of the semiconductor devices disclosed herein. One or more dies 1402 may include any other circuitry used to interface with other devices formed on the dies, or other devices connected to chip package 1400, in some example configurations.

As can be further seen, chip package 1400 includes a housing 1404 that is bonded to a package substrate 1406. The housing 1404 may be any standard or proprietary housing, and may provide, for example, electromagnetic shielding and environmental protection for the components of chip package 1400. The one or more dies 1402 may be conductively coupled to a package substrate 1406 using connections 1408, which may be implemented with any number of standard or proprietary connection mechanisms, such as solder bumps, ball grid array (BGA), pins, or wire bonds, to name a few examples. Package substrate 1406 may be any standard or proprietary package substrate, but in some cases includes a dielectric material having conductive pathways (e.g., including conductive vias and lines) extending through the dielectric material between the faces of package substrate 1406, or between different locations on each face. In some embodiments, package substrate 1406 may have a thickness less than 1 millimeter (e.g., between 0.1 millimeters and 0.5 millimeters), although any number of package geometries can be used. Additional conductive contacts 1412 may be disposed at an opposite face of package substrate 1406 for conductively contacting, for instance, a printed circuit board (PCB). One or more vias 1410 extend through a thickness of package substrate 1406 to provide conductive pathways between one or more of connections 1408 to one or more of contacts 1412. Vias 1410 are illustrated as single straight columns through package substrate 1406 for ease of illustration, although other configurations can be used (e.g., damascene, dual damascene, through-silicon via, or an interconnect structure that meanders through the thickness of substrate 1406 to contact one or more intermediate locations therein). In still other embodiments, vias 1410 are fabricated by multiple smaller stacked vias, or are staggered at different locations across package substrate 1406. In the illustrated embodiment, contacts 1412 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 1412, to inhibit shorting.

In some embodiments, a mold material 1414 may be disposed around the one or more dies 1402 included within housing 1404 (e.g., between dies 1402 and package substrate 1406 as an underfill material, as well as between dies 1402 and housing 1404 as an overfill material). Although the dimensions and qualities of the mold material 1414 can vary from one embodiment to the next, in some embodiments, a thickness of mold material 1414 is less than 1 millimeter. Example materials that may be used for mold material 1414 include epoxy mold materials, as suitable. In some cases, the mold material 1414 is thermally conductive, in addition to being electrically insulating.

Methodology

FIG. 15 is a flow chart of a method 1500 for forming at least a portion of an integrated circuit, according to an embodiment. Various operations of method 1500 may be illustrated in FIGS. 2A-13A and 2B-13B. However, the correlation of the various operations of method 1500 to the specific components illustrated in the aforementioned figures is not intended to imply any structural and/or use limitations. Rather, the aforementioned figures provide one example embodiment of method 1500. Other operations may be performed before, during, or after any of the operations of method 1500. For example, method 1500 does not explicitly describe various standard processes that are usually performed to form transistor structures. Some of the operations of method 1500 may be performed in a different order than the illustrated order.

Method 1500 begins with operation 1502 where a plurality of parallel semiconductor fins are formed, according to some embodiments. The semiconductor material in the fins may be formed from a substrate such that the fins are an integral part of the substrate (e.g., etched from a bulk silicon substrate). Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around (GAA) process can then be carried out. Again, the alternating layers can be blanket deposited and then etched into fins, or deposited into fin-shaped trenches. The fins may also include a cap structure over each fin that is used to define the locations of the fins during, for example, an RIE process. The cap structure may be a dielectric material, such as silicon nitride.

Portions of the substrate may be recessed adjacent to the fins and subsequently filled with a first dielectric fill to form a dielectric layer between a lower portion of the fins. The lower portion of the fins adjacent to the first dielectric fill are subfins that are formed from the substrate.

Method 1500 continues with operation 1504 where sacrificial gates and spacer structures are formed over the fins. The sacrificial gates may be patterned using gate masking layers in strips that run orthogonally over the fins and parallel to one another (e.g., forming a cross-hatch pattern). The gate masking layers may be any suitable hard mask material, such as CHM or silicon nitride. The sacrificial gates themselves may be formed from any suitable material that can be selectively removed at a later time without damaging the semiconductor material of the fins. In one example, the sacrificial gates include polysilicon.

According to some embodiments, spacer structures are also formed on sidewalls of at least the sacrificial gates. The spacer structures may be deposited and then etched back such that the spacer structures remain mostly only on sidewalls of any exposed structures. In some cases, spacer structures may also be formed along sidewalls of the exposed fins running orthogonally between the strips of sacrificial gates. According to some embodiments, the spacer structures may be any suitable dielectric material, such as silicon nitride or silicon oxynitride.

Method 1500 continues with operation 1506 where source/drain trenches are etched through portions of the semiconductor fins not protected by the sacrificial gates and spacer structures. An anisotropic etching process, such as reactive ion etching (RIE), may be performed through the semiconductor material of the fin and through at least a portion of the subfin to form the source/drain trenches. In some examples, the depth of the source/drain trenches extends past the bottom surface of the dielectric fill and into the substrate.

Method 1500 continues with operation 1508 where source and drain regions are formed at opposite ends of the fins within the source/drain trenches. According to some embodiments, the source and drain regions are epitaxially grown from the exposed semiconductor material of the fins (or nanoribbons, nanowires or nanosheets, as the case may be) along the exterior walls of the spacer structures. In some example embodiments, the source and drain regions are NMOS source and drain regions (e.g., epitaxial silicon) or PMOS source and drain regions (e.g., epitaxial SiGe). A second dielectric fill may be formed between and over the source or drain regions along a given source/drain trench. The second dielectric fill may be any suitable dielectric material, such as silicon dioxide. In some examples, the second dielectric fill extends over the source or drain regions up to and planar with a top surface of the spacer structures. The second dielectric fill also acts as an electrical insulator between adjacent source or drain regions, although some adjacent source or drain regions may have merged together during their growth.

Method 1500 continues with operation 1510 where gate structures are formed over the semiconductor material of the various semiconductor fins. The sacrificial gates are first removed along with any sacrificial layers within the exposed fins between the spacer structures (in the case of GAA structures). The gate structures may then be formed in place of the sacrificial gates. The gate structures may each include both a gate dielectric and a gate electrode. The gate dielectric is first formed over the exposed semiconductor regions between the spacer structures followed by forming the gate electrode within the remainder of the trench between the spacer structures, according to some embodiments. The gate dielectric may include any number of dielectric layers deposited using a CVD process, such as ALD. The gate electrode can include any conductive material, such as a metal, metal alloy, or polysilicon. The gate electrode may be deposited using electroplating, electroless plating, CVD, ALD, PECVD, or PVD, to name a few examples.

Method 1500 continues with operation 1512 where the substrate is removed from the backside of the device. The substrate may be removed via any combination of grinding, polishing, and/or etching processes. In some embodiments, the substrate may continue to be thinned from the backside until bottom surfaces of the first dielectric fill and/or the subfin portions adjacent to the first dielectric fill are exposed.

Method 1500 continues with operation 1514 where the subfins and portions of the source and/or drain regions are etched from the backside. An isotropic etching process may be performed to remove the semiconductor material of the subfins and also remove portions of the bottom ends of source and/or drain regions. During the removal of the subfins, the underside of the gate dielectric is exposed, so the etch may be tailored to selectively remove the semiconductor materials of the subfin and the source and/or drain regions as opposed to the dielectric materials, such as the gate dielectric. In some examples, the etching process includes bromine and hydrogen gases to provide the desired selectivity. In some examples, standard silicon isotropic etching procedures are used to etch both the subfins and the source and/or drain regions. In some embodiments, the etching process may take between 5 and 10 seconds to remove the subfins and portions of the bottom ends of the source and/or drain regions. According to some embodiments, the bottom ends of the source and/or drain regions take on an inwardly tapered shape as a result of the etching process.

Method 1500 continues with operation 1516 where a base dielectric layer is formed around the inwardly tapered bottom ends of the source and/or drain regions. The base dielectric layer may include any suitable dielectric material, such as silicon nitride, silicon dioxide, or silicon oxynitride and may be deposited using any suitable dielectric material deposition technique, such as CVD, PECVD, ALD, or PVD. According to some embodiments, the base dielectric layer surrounds the inwardly tapered bottom ends of the source and/or drain regions and extends along the second direction beneath the gate structures. In some examples, the base dielectric layer includes various dielectric materials that have been previous formed such as the first dielectric fill and any dielectric material present at the base of the source/drain trenches. According to some embodiments, any number of backside interconnect structures are formed on a bottom surface of the base dielectric layer, or on other dielectric layers formed beneath the bottom surface of the base dielectric layer.

Example System

Figure 16:
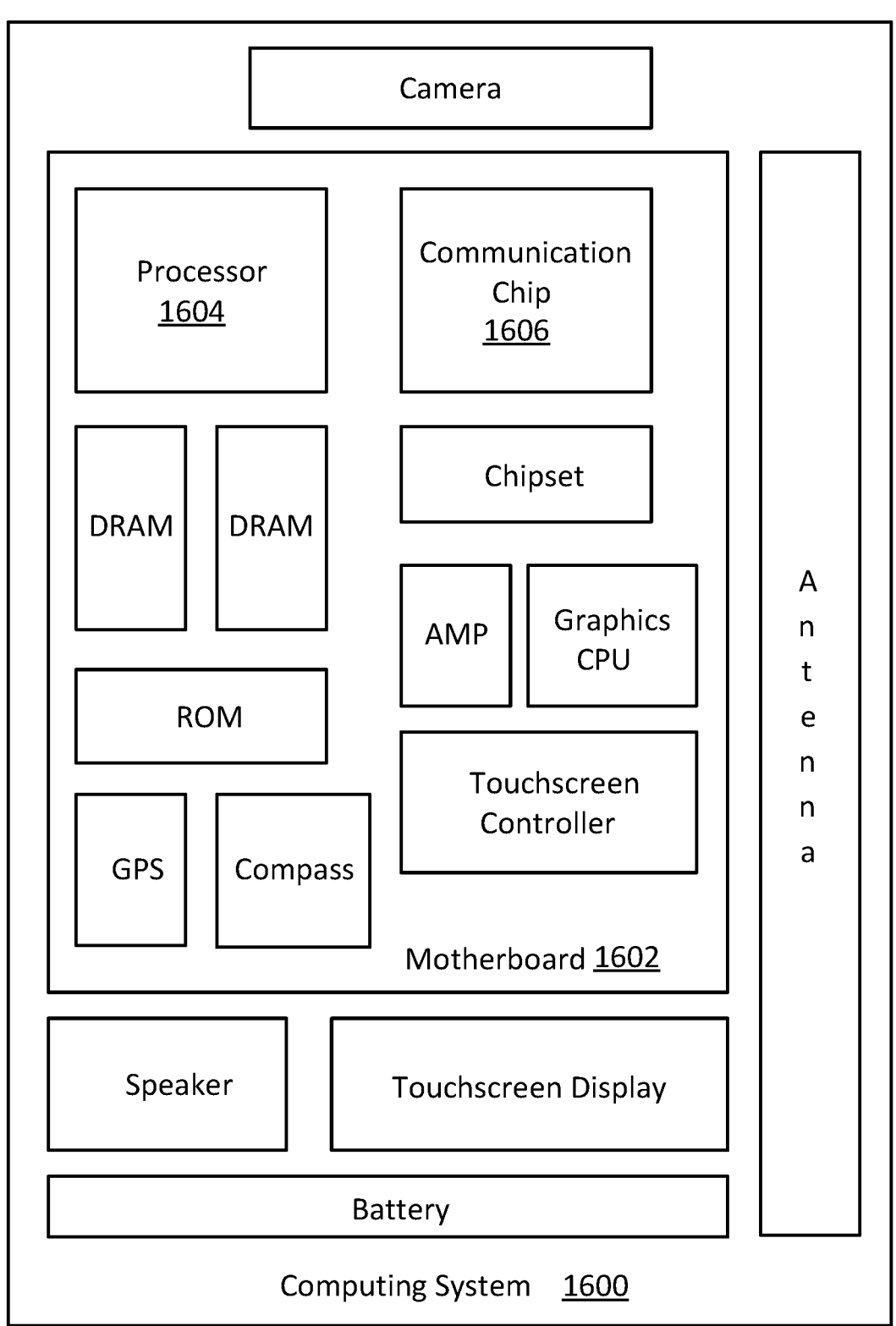
FIG. 16 illustrates a computing system including one or more integrated circuits, as variously described herein, in accordance with an embodiment of the present disclosure.

FIG. 16 is an example computing system implemented with one or more of the integrated circuit structures as disclosed herein, in accordance with some embodiments of the present disclosure. As can be seen, the computing system 1600 houses a motherboard 1602. The motherboard 1602 may include a number of components, including, but not limited to, a processor 1604 and at least one communication chip 1606, each of which can be physically and electrically coupled to the motherboard 1602, or otherwise integrated therein. As will be appreciated, the motherboard 1602 may be, for example, any printed circuit board (PCB), whether a main board, a daughterboard mounted on a main board, or the only board of system 1600, etc.

Depending on its applications, computing system 1600 may include one or more other components that may or may not be physically and electrically coupled to the motherboard 1602. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1600 may include one or more integrated circuit structures or devices configured in accordance with an example embodiment (e.g., a module including an integrated circuit device on a substrate, the substrate having one or more semiconductor devices that include source and/or drain regions having an inwardly tapered bottom end, as variously provided herein). In some embodiments, multiple functions can be integrated into one or more chips (e.g., for instance, note that the communication chip 1606 can be part of or otherwise integrated into the processor 1604).

The communication chip 1606 enables wireless communications for the transfer of data to and from the computing system 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1606 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1600 may include a plurality of communication chips 1606. For instance, a first communication chip 1606 may be dedicated to shorter range wireless communications such as Wi-Fi and Bluetooth and a second communication chip 1606 may be dedicated to longer range wireless communications such as GPS, EDGE, GPRS, CDMA, WiMAX, LTE, Ev-DO, and others.

The processor 1604 of the computing system 1600 includes an integrated circuit die packaged within the processor 1604. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 1606 also may include an integrated circuit die packaged within the communication chip 1606. In accordance with some such example embodiments, the integrated circuit die of the communication chip includes one or more semiconductor devices as variously described herein. As will be appreciated in light of this disclosure, note that multi-standard wireless capability may be integrated directly into the processor 1604 (e.g., where functionality of any chips 1606 is integrated into processor 1604, rather than having separate communication chips). Further note that processor 1604 may be a chip set having such wireless capability. In short, any number of processor 1604 and/or communication chips 1606 can be used. Likewise, any one chip or chip set can have multiple functions integrated therein.

In various implementations, the computing system 1600 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 1600 may be combined or integrated in a system-on-a-chip (SoC) architecture. In some embodiments, the components may be hardware components, firmware components, software components or any suitable combination of hardware, firmware or software.

FURTHER EXAMPLE EMBODIMENTS

The following examples pertain to further embodiments, from which numerous permutations and configurations will be apparent.

Example 1 is an integrated circuit includes a semiconductor region having one or more semiconductor nanoribbons extending from a source or drain region in a first direction, a gate structure extending over the semiconductor region in a second direction different from the first direction, and a dielectric layer adjacent to a portion of the gate structure below the semiconductor region and adjacent to a portion of the source or drain region below the semiconductor region. The portion of the source or drain region has an inwardly tapered end having a concave profile.

Example 2 includes the integrated circuit of Example 1, wherein the one or more semiconductor nanoribbons comprise germanium, silicon, or any combination thereof.

Example 3 includes the integrated circuit of Example 1 or 2, wherein the gate structure comprises a gate electrode and a gate dielectric, and wherein the dielectric layer contacts the gate dielectric on the portion of the gate structure.

Example 4 includes the integrated circuit of Example 3, wherein the gate dielectric comprises hafnium and oxygen.

Example 5 includes the integrated circuit of any one of Examples 1-4, wherein the dielectric layer comprises silicon and oxygen.

Example 6 includes the integrated circuit of any one of Examples 1-5, further comprising a contact on a top surface of the source or drain region.

Example 7 includes the integrated circuit of any one of Examples 1-6, wherein the semiconductor region is a first semiconductor region having first one or more semiconductor nanoribbons, and the integrated circuit further comprises a second semiconductor region having second one or more semiconductor nanoribbons extending from the source or drain region in the first direction, such that the source or drain region is between the first semiconductor region and the second semiconductor region.

Example 8 is a printed circuit board comprising the integrated circuit of any one of Examples 1-7.

Example 9 is an electronic device that includes a chip package comprising one or more dies. At least one of the one or more dies includes a semiconductor device having a semiconductor region extending in a first direction from a source or drain region and a gate structure extending over the semiconductor region in a second direction different from the first direction, and a dielectric layer adjacent to a portion of the gate structure below the semiconductor region and adjacent to a portion of the source or drain region below the semiconductor region. The portion of the source or drain region has a concave profile that increases the distance between the portion of the source or drain region and the gate structure.

Example 10 includes the electronic device of Example 9, wherein the semiconductor region comprises germanium, silicon, or any combination thereof.

Example 11 includes the electronic device of Example 9 or 10, wherein the gate structure comprises a gate electrode and a gate dielectric, and wherein the dielectric layer contacts the gate dielectric on the portion of the gate structure.

Example 12 includes the electronic device of Example 11, wherein the gate dielectric comprises hafnium and oxygen.

Example 13 includes the electronic device of any one of Examples 9-12, wherein the dielectric layer comprises silicon and oxygen Example 14 includes the electronic device of any one of Examples 9-13, wherein the at least one of the one or more dies further comprises a contact on a top surface of the source or drain region.

Example 15 includes the electronic device of any one of Examples 9-14, wherein the semiconductor device is a first semiconductor device having a first semiconductor region, and the at least one of the one or more dies further comprises a second semiconductor device having a second semiconductor region extending from the source or drain region in the first direction, such that the source or drain region is between the first semiconductor region and the second semiconductor region.

Example 16 includes the electronic device of Example 15, wherein the semiconductor region comprises one or more semiconductor nanoribbons.

Example 17 includes the electronic device of any one of Examples 9-16, further comprising a printed circuit board, wherein the chip package is attached to the printed circuit board.

Example 18 is a method of forming an integrated circuit. The method includes forming a multilayer fin extending in a first direction over a substrate having a first section with first material layers alternating with second material layers, and a subfin beneath the first section; forming a first dielectric layer adjacent to the subfin; forming a sacrificial gate and spacers on sidewalls of the sacrificial gate, the sacrificial gate extending in a second direction over the multilayer fin, the second direction being different from the first direction; removing an exposed portion of the multilayer fin adjacent to the sacrificial gate and etching a recess through a portion of the subfin; forming a source or drain region from ends of the second material layers and within the recess; replacing the sacrificial gate with a gate structure; removing a portion of the substrate from a backside of the integrated circuit to expose a bottom surface of the subfin; etching the subfin and a bottom end of the source or drain region, such that the bottom end of the source or drain region takes on an inwardly tapered shape; and forming a second dielectric layer around the bottom end of the source or drain region.

Example 19 includes the method of Example 18, wherein the first material layers comprise silicon and germanium and the second material layers comprise silicon.

Example 20 includes the method of Example 18 or 19, further comprising forming a dielectric plug at the bottom of the recess prior to forming the source or drain region.

Example 21 includes the method of any one of Examples 18-20, further comprising and forming one or more backside conductive traces on a bottom surface of the second dielectric layer.

Example 22 includes the method of any one of Examples 18-21, wherein the etching comprises etching using bromine and hydrogen.

Example 23 is an integrated circuit that includes a source or drain region of a semiconductor device and having a first portion adjacent to a semiconductor region of the semiconductor device and a second portion below the first portion, and a dielectric layer adjacent to the second portion of the source or drain region. The second portion of the source or drain region has an inwardly tapered end having a concave profile.

Example 24 includes the integrated circuit of Example 23, wherein the dielectric layer comprises silicon and oxygen.

Example 25 includes the integrated circuit of Example 23 or 24, further comprising a contact on a top surface of the source or drain region.

Example 26 includes the integrated circuit of any one of Examples 23-25, wherein the semiconductor region is a first semiconductor region of a first semiconductor device and the first portion of the source or drain region is further adjacent to a second semiconductor region of a second semiconductor device.

Example 27 is a printed circuit board comprising the integrated circuit of any one of Examples 23-26.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:
   a semiconductor region having one or more semiconductor nanoribbons extending from a source or drain region in a first direction;
   a gate structure extending over the semiconductor region in a second direction different from the first direction; and
   a dielectric layer adjacent to a portion of the gate structure below the semiconductor region and adjacent to a portion of the source or drain region below the semiconductor region,
   wherein the portion of the source or drain region comprises an inwardly tapered end having a concave profile.

2. The integrated circuit of claim 1, wherein the one or more semiconductor nanoribbons comprise germanium, silicon, or any combination thereof.

3. The integrated circuit of claim 1, wherein the gate structure comprises a gate electrode and a gate dielectric, and wherein the dielectric layer contacts the gate dielectric on the portion of the gate structure.

4. The integrated circuit of claim 3, wherein the gate dielectric comprises hafnium and oxygen.

5. The integrated circuit of claim 1, wherein the dielectric layer comprises silicon and oxygen.

6. The integrated circuit of claim 1, further comprising a contact on a top surface of the source or drain region.

7. The integrated circuit of claim 1, wherein the semiconductor region is a first semiconductor region having first one or more semiconductor nanoribbons, and the integrated circuit further comprises a second semiconductor region having second one or more semiconductor nanoribbons extending from the source or drain region in the first direction, such that the source or drain region is between the first semiconductor region and the second semiconductor region.

8. A printed circuit board comprising the integrated circuit of claim 1.

9. An electronic device, comprising:
a chip package comprising one or more dies, at least one of the one or more dies comprising
a semiconductor device having a semiconductor region extending in a first direction from a source or drain region, and a gate structure extending over the semiconductor region in a second direction different from the first direction; and
a dielectric layer adjacent to a portion of the gate structure below the semiconductor region and adjacent to a portion of the source or drain region below the semiconductor region;
wherein the portion of the source or drain region has a concave profile that increases the distance between the portion of the source or drain region and the gate structure.

10. The electronic device of claim 9, wherein the gate structure comprises a gate electrode and a gate dielectric, and wherein the dielectric layer contacts the gate dielectric on the portion of the gate structure.

11. The electronic device of claim 10, wherein the gate dielectric comprises hafnium and oxygen.

12. The electronic device of claim 9, wherein the dielectric layer comprises silicon and oxygen.

13. The electronic device of claim 9, wherein the at least one of the one or more dies further comprises a contact on a top surface of the source or drain region.

14. The electronic device of claim 9, wherein the semiconductor device is a first semiconductor device having a first semiconductor region, and the at least one of the one or more dies further comprises a second semiconductor device having a second semiconductor region extending from the source or drain region in the first direction, such that the source or drain region is between the first semiconductor region and the second semiconductor region.

15. The electronic device of claim 14, wherein the first semiconductor region comprises one or more semiconductor nanoribbons, and the second semiconductor region comprises one or more semiconductor nanoribbons.

16. The electronic device of claim 9, further comprising a printed circuit board, wherein the chip package is attached to the printed circuit board.

17. An integrated circuit comprising:
a source or drain region of a semiconductor device, the source or drain region having a first portion adjacent to a semiconductor region of the semiconductor device and a second portion below the first portion; and
a dielectric layer adjacent to the second portion of the source or drain region,
wherein the second portion of the source or drain region has an inwardly tapered end having a concave profile.

18. The integrated circuit of claim 17, wherein the dielectric layer comprises silicon and oxygen.

19. The integrated circuit of claim 17, further comprising a contact on a top surface of the source or drain region.

20. The integrated circuit of claim 17, wherein the semiconductor region is a first semiconductor region of a first semiconductor device and the first portion of the source or drain region is further adjacent to a second semiconductor region of a second semiconductor device.

* * * * *